United States Patent
Fukuda

(10) Patent No.: US 9,625,675 B2
(45) Date of Patent: Apr. 18, 2017

(54) IMAGE SENSOR AND IMAGE CAPTURING APPARATUS

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/046,150

(22) Filed: Oct. 4, 2013

(65) Prior Publication Data

US 2014/0111681 A1    Apr. 24, 2014

(30) Foreign Application Priority Data

Oct. 19, 2012    (JP) .................................. 2012-232334

(51) Int. Cl.
| | |
|---|---|
| *H04N 5/232* | (2006.01) |
| *G02B 7/34* | (2006.01) |
| *H01L 27/146* | (2006.01) |

(52) U.S. Cl.
CPC .......... *G02B 7/34* (2013.01); *H01L 27/14623* (2013.01); *H01L 27/14627* (2013.01); *H04N 5/23212* (2013.01)

(58) Field of Classification Search
USPC ....................................................... 348/345
See application file for complete search history.

(56) References Cited

U.S. PATENT DOCUMENTS

| | | | |
|---|---|---|---|
| 4,410,804 | A | 10/1983 | Stauffer |
| 7,792,420 | B2 | 9/2010 | Kusaka |
| 2007/0215912 | A1 | 9/2007 | Kido |
| 2010/0045849 | A1 | 2/2010 | Yamasaki |

(Continued)

FOREIGN PATENT DOCUMENTS

| | | |
|---|---|---|
| CN | 102227665 A | 10/2011 |
| JP | 2000-156823 A | 6/2000 |

(Continued)

OTHER PUBLICATIONS

European Search Report issued on Feb. 7, 2014 that issued in the corresponding European Patent Application No. 13187926.4.

(Continued)

*Primary Examiner* — Stephen Coleman
(74) *Attorney, Agent, or Firm* — Cowan, Liebowitz & Latman, P.C.

(57) ABSTRACT

An image sensor includes a plurality of image forming pixels which receive light beams passing through an imaging pupil area of an imaging optical system, a plurality of first focus detecting pixels which receive light beams passing through a first pupil area smaller than the imaging pupil area, and a plurality of second focus detecting pixels which receive light beams passing through a second pupil area smaller than the imaging pupil area. The geometric center of the first pupil area differs from the geometric center of the second pupil area. The eccentricity of the microlens of the first focus detecting pixel relative to the center of the pixel differs from the eccentricity of the first focus detecting pixel relative to the center of the pixel of the microlens of the image forming pixel adjacent to the first focus detecting pixel.

20 Claims, 19 Drawing Sheets

(56) References Cited

U.S. PATENT DOCUMENTS

| | | | |
|---|---|---|---|
| 2010/0176273 A1* | 7/2010 | Shimoda | H01L 27/14623 250/208.1 |
| 2011/0076001 A1 | 3/2011 | Iwasaki | |
| 2011/0102653 A1* | 5/2011 | Shintani | G02B 3/005 348/294 |
| 2011/0279727 A1* | 11/2011 | Kusaka | H01L 27/14621 348/340 |
| 2012/0224096 A1 | 9/2012 | Shimoda | |

FOREIGN PATENT DOCUMENTS

| | | |
|---|---|---|
| JP | 2009-015164 A | 1/2009 |
| JP | 2009-290157 A | 12/2009 |
| JP | 2011-077829 A | 4/2011 |
| JP | 2012-038768 A | 2/2012 |
| JP | 2012-505422 A | 3/2012 |
| JP | 2012-113027 A | 6/2012 |
| JP | 2012-182332 A | 9/2012 |

OTHER PUBLICATIONS

Oct. 6, 2015 Korean Office Action that issued in Korean Patent Application No. 10-2013-0123688.

Jul. 4, 2016 Chinese Office Action, which is enclosed with an English Translation, that issued in Chinese Patent Application No. 201310491878.5.

Sep. 9, 2016 Japanese Office Action, which is enclosed without an English Translation, that issued in Japanese Patent Application No. 2012232334.

* cited by examiner

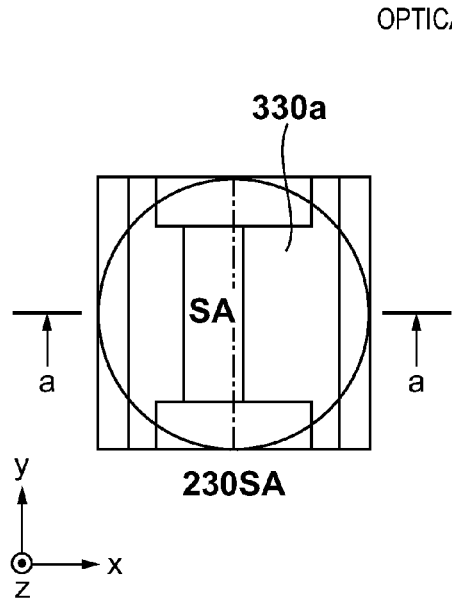
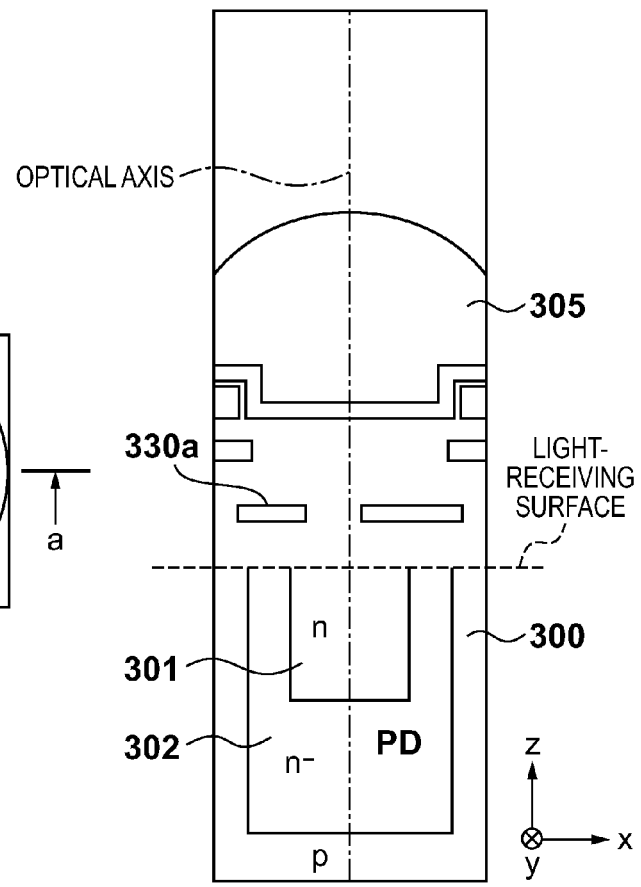
F I G. 3A
F I G. 3B

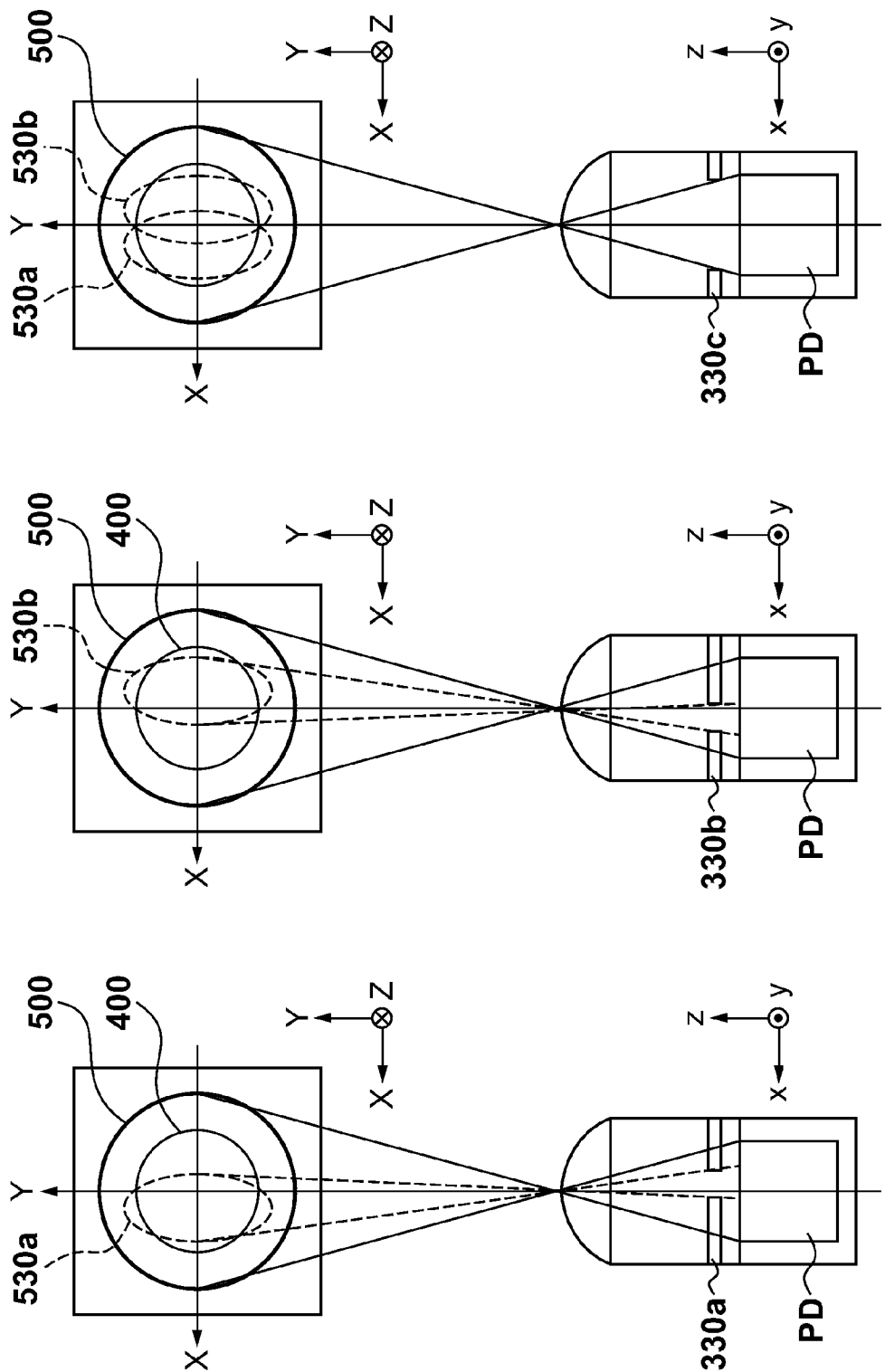

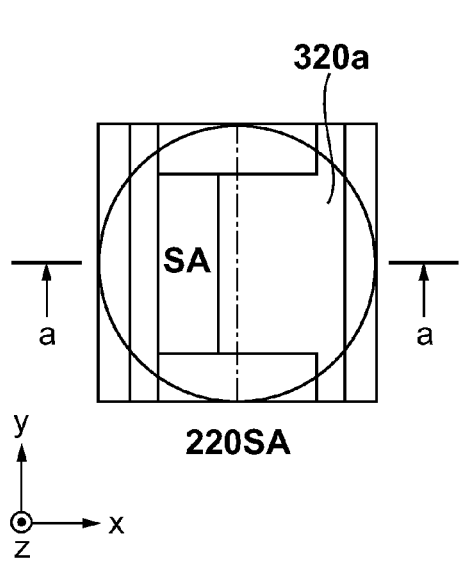
F I G. 7A
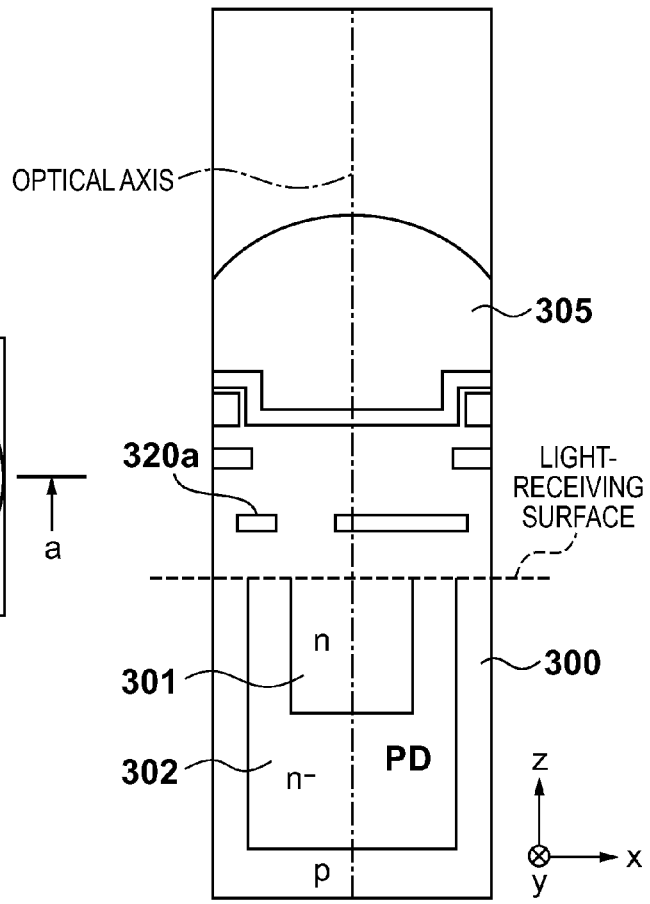
F I G. 7B

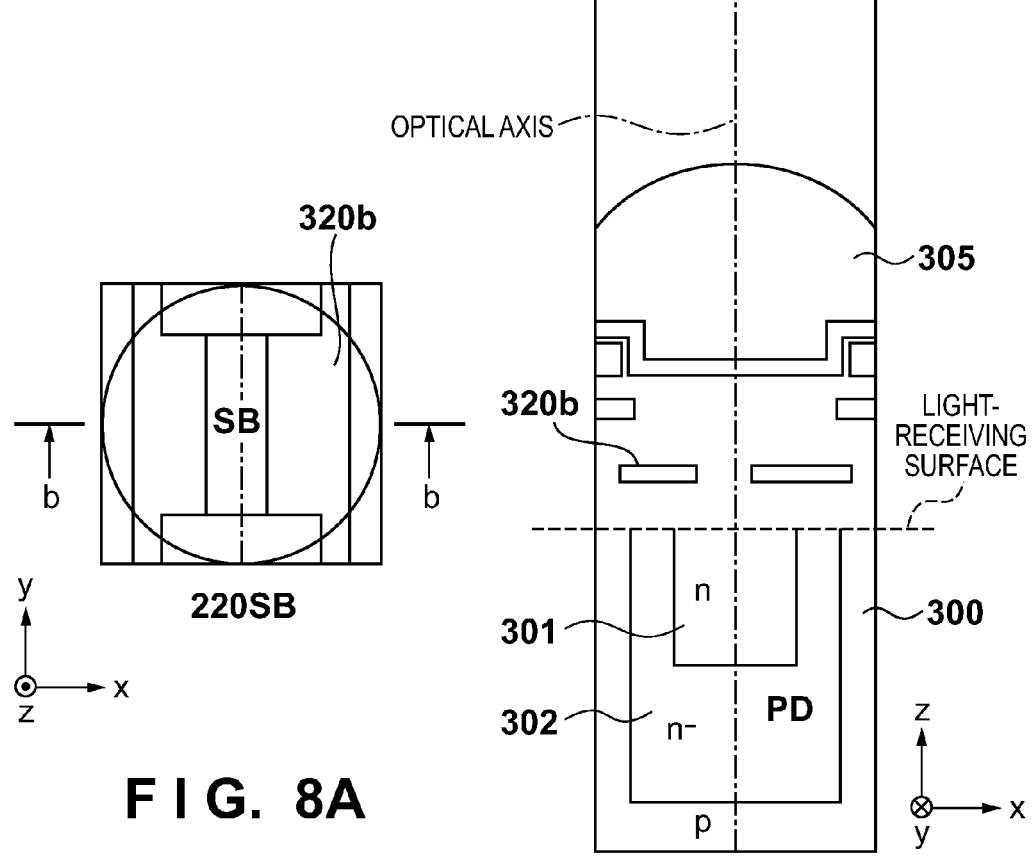
F I G. 8A
F I G. 8B

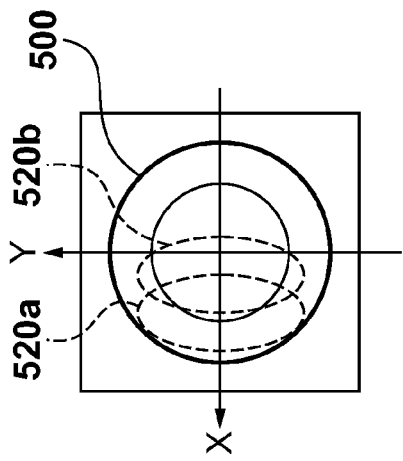
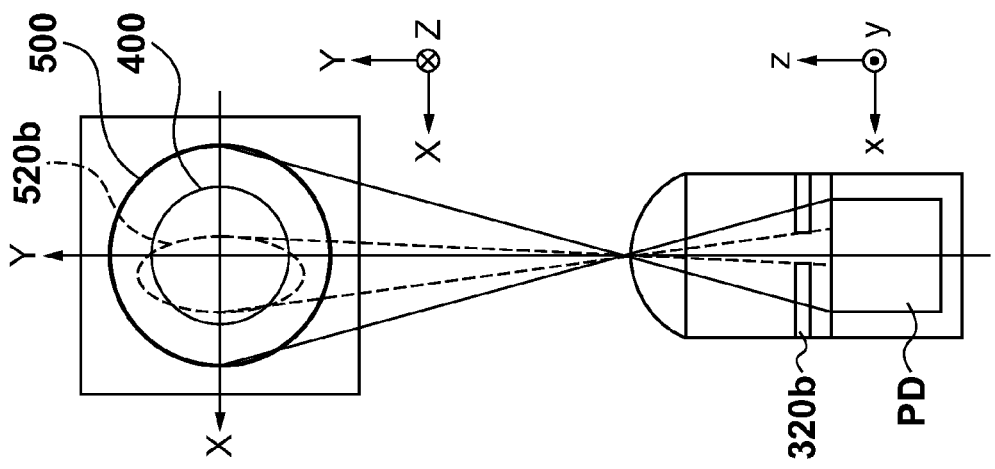
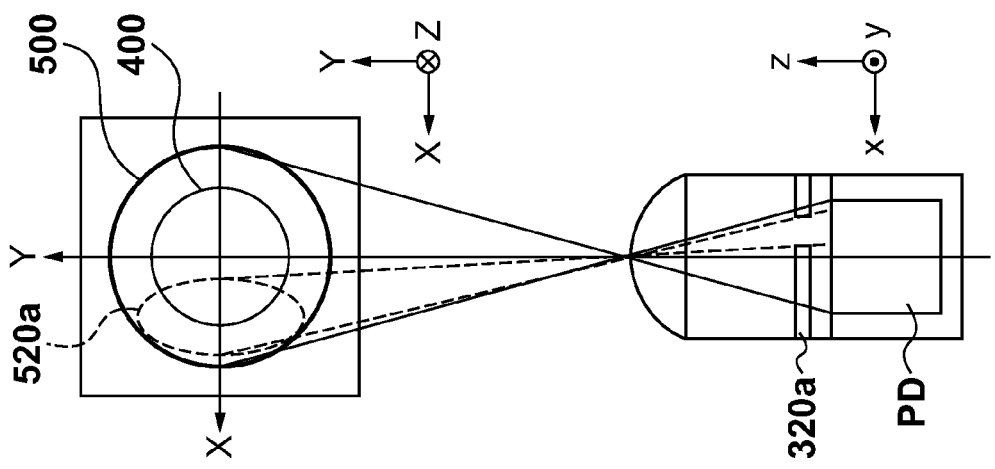

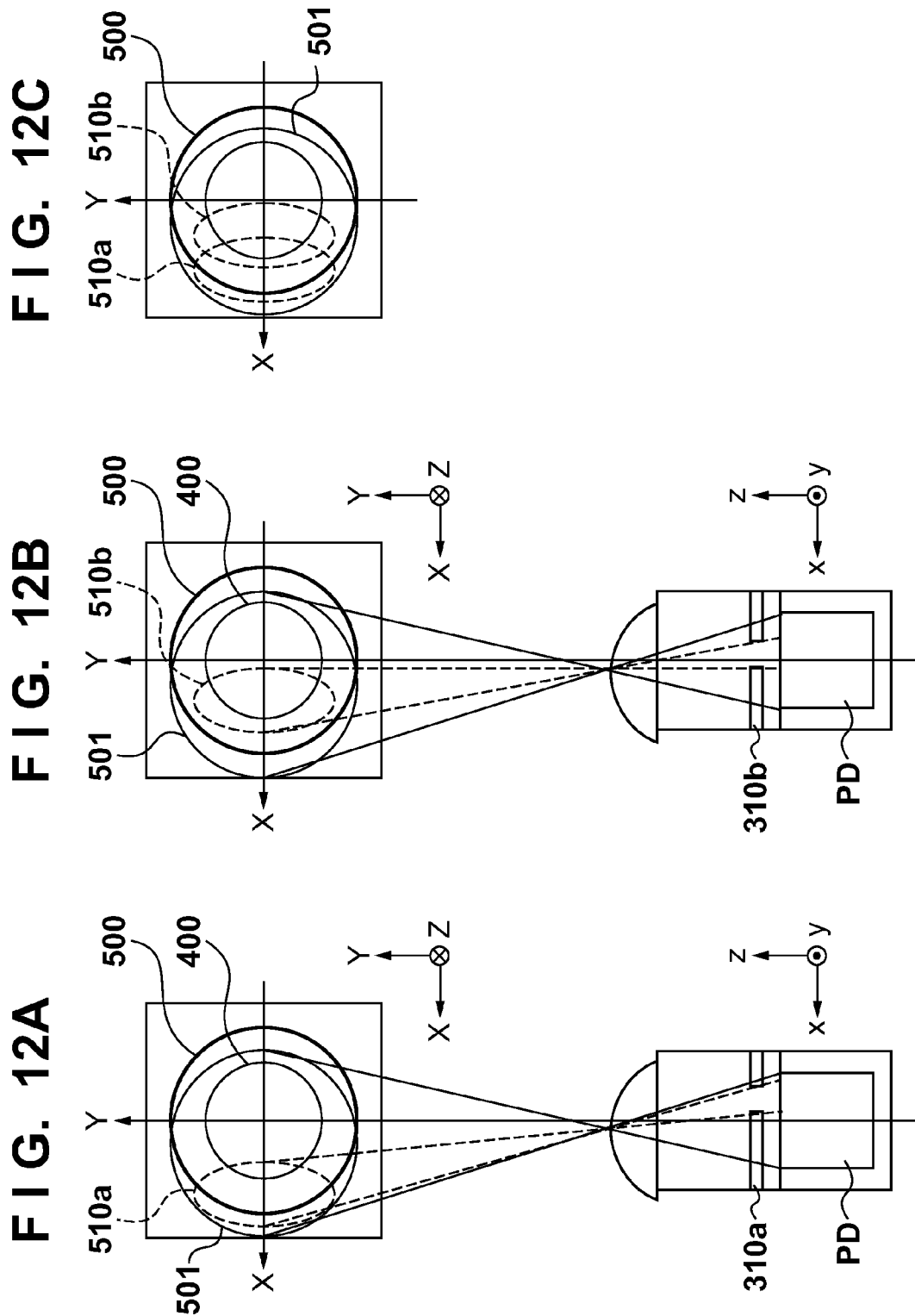

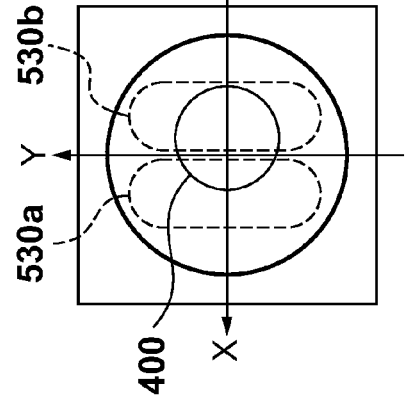
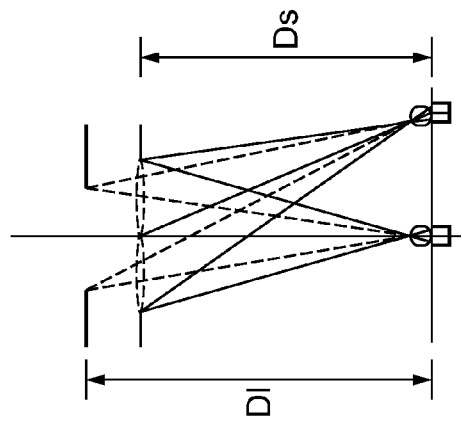
FIG. 13A
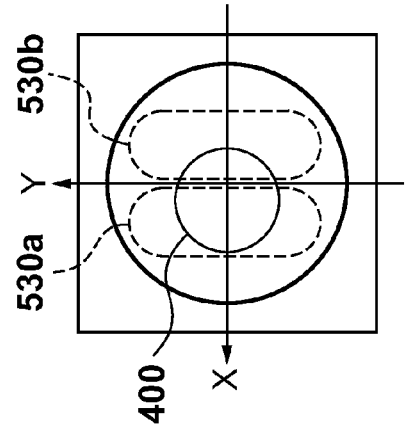
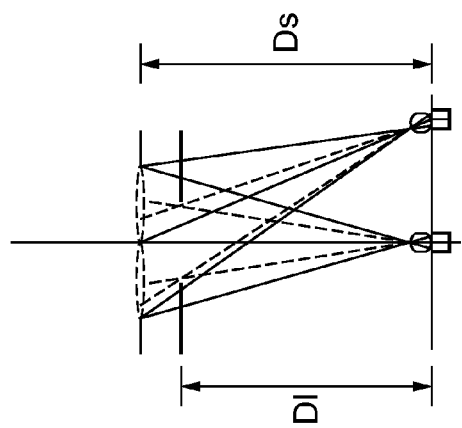
FIG. 13B
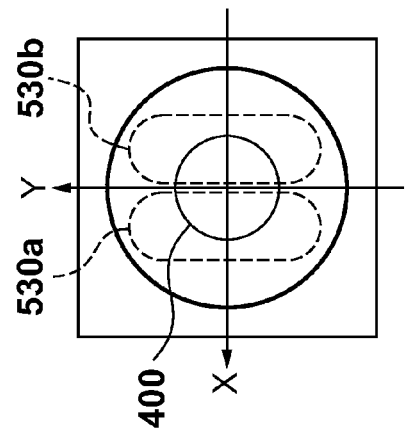
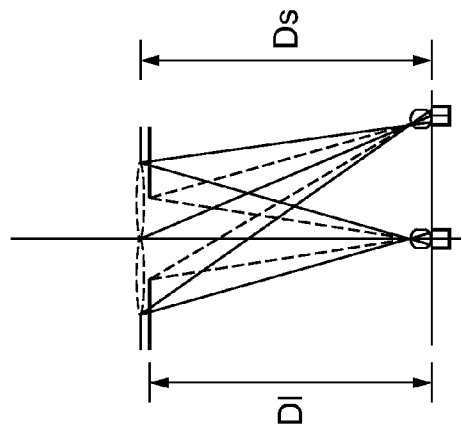
FIG. 13C

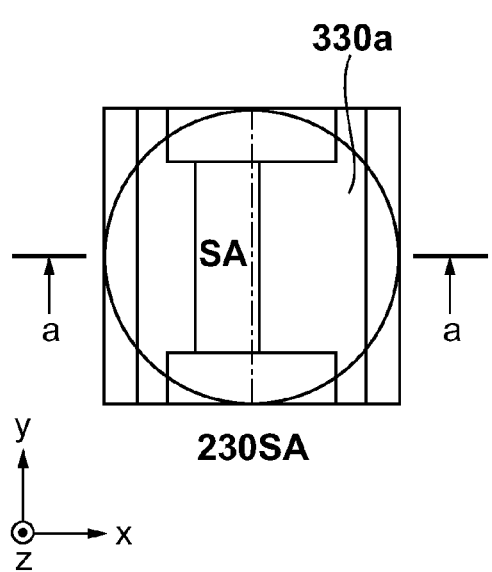
F I G. 15A
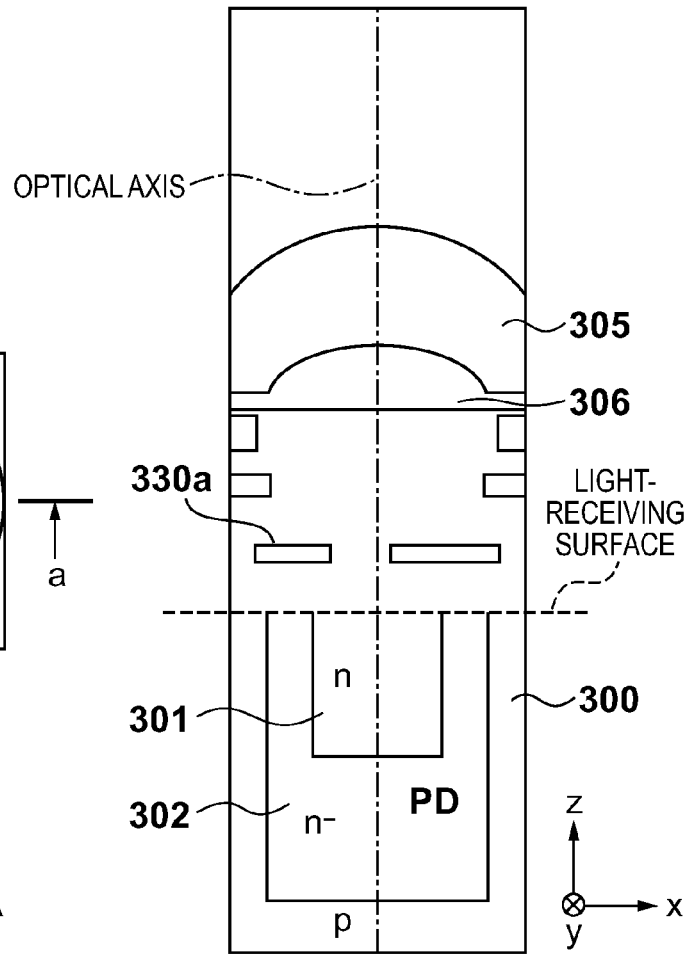
F I G. 15B

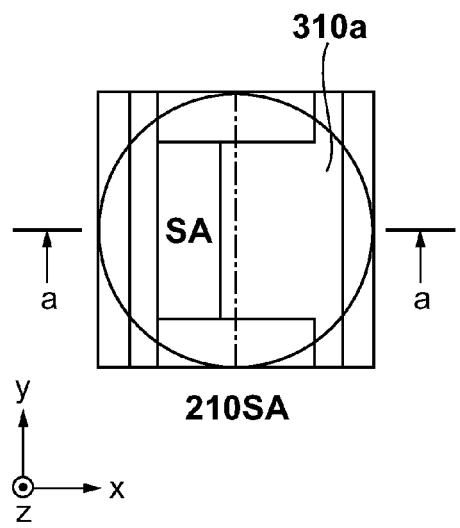
F I G. 18A
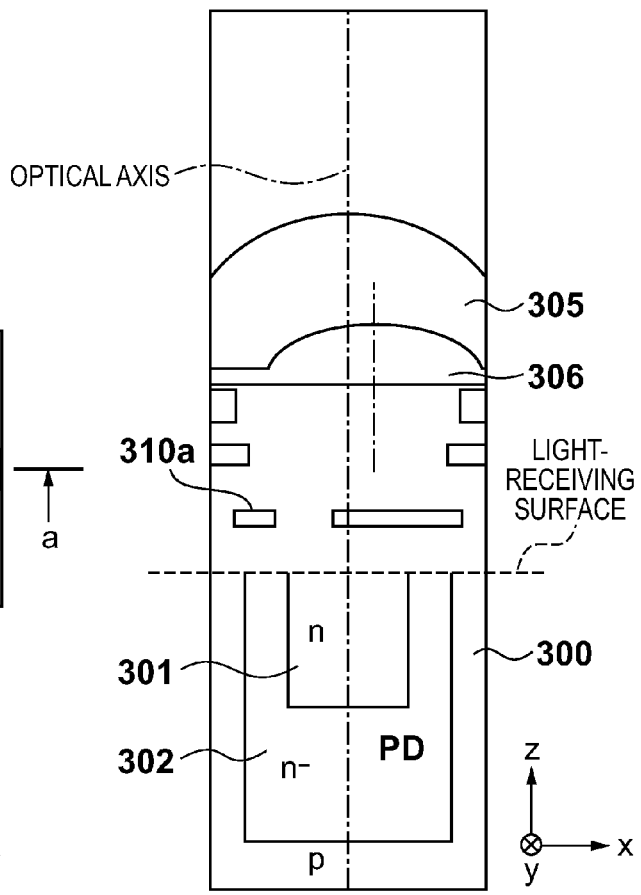
F I G. 18B

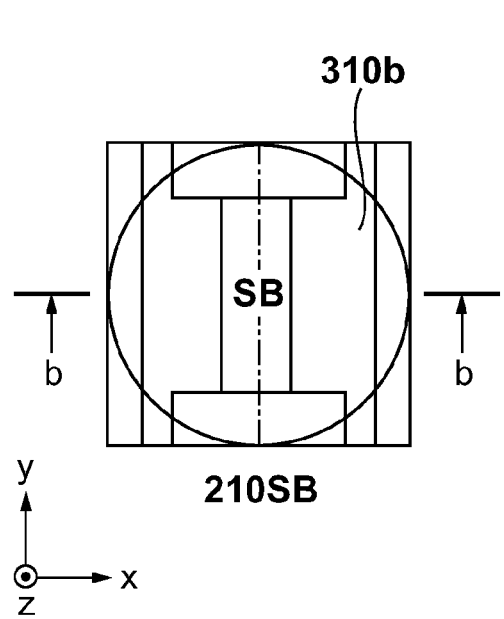
F I G. 19A
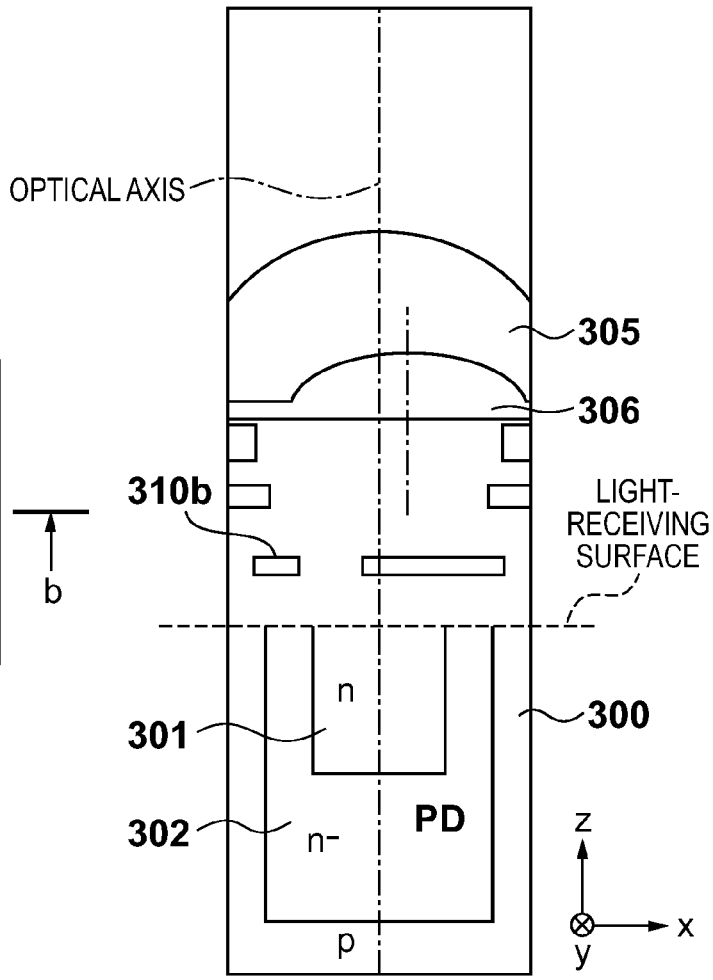
F I G. 19B

IMAGE SENSOR AND IMAGE CAPTURING APPARATUS

BACKGROUND OF THE INVENTION

1. Field of the Invention

The present invention relates to an image sensor and an image capturing apparatus using the same.

2. Description of the Related Art

There has been proposed an image capturing apparatus using, as a method of detecting the focus state of an imaging lens, a pupil division phase-difference method (imaging plane phase-difference method) using a two-dimensional image sensor having a microlens formed on each pixel.

In an optical system, such as a camera lens unit, the entrance pupil is the optical image of the aperture stop viewed from the front of the lens. The corresponding image of the aperture viewed from the rear of the lens is known as the exit pupil. The image of the aperture stop will be in focus at a particular distance beyond the camera lens unit and this distance is known as the pupil distance of the imaging lens. Modern image sensors often include microlens arrays around the pixels in order to improve light capture efficiency. As a consequence of this, the image sensor is only able to accept light from a limited range of angles and each photodiode, and hence the image sensor, has an entrance pupil that is an image of the openings to the photodiodes viewed through the microlenses. The entrance pupil distance of the image sensor is a distance at which those openings are in focus through the microlenses.

U.S. Pat. No. 4,410,804 discloses an image capturing apparatus using a two-dimensional image sensor having one microlens and a plurality of divided photo-electric conversion portions formed for one pixel. Divided photo-electric conversion portions are configured to receive light from different areas of the exit pupil of the imaging lens through one microlens, thereby performing pupil division. This apparatus performs focus detection by obtaining an image shift amount from the respective signals received by these divided photo-electric conversion portions, and acquires an imaging signal by adding the signals received by the divided photo-electric conversion portions. This patent literature also discloses that the apparatus can obtain a stereoscopic image by separately displaying the parallax signals, received by the laterally divided photo-electric conversion portions on each pixel, for the right and left eyes. Japanese Patent Laid-Open No. 2000-156823 discloses an image capturing apparatus having a pair of focus detecting pixels partially arranged in a two-dimensional image sensor constituted by a plurality of image forming pixels. The pair of focus detecting pixels are configured to receive light from different areas of the exit pupil of the imaging lens through a light-shielding layer having an opening, thereby performing pupil division. This apparatus acquires imaging signals using image forming pixels arranged on the most part of the two-dimensional sensor and performs focus detection by obtaining an image shift amount from signals from the focus detecting pixels partially arranged on the sensor.

Consider, for example, a camera with interchangeable lenses. In this case, if the exit pupil distance of the imaging lens differs from the incident pupil distance of the image sensor, an increase in the image height at the image sensor will cause a pupil shift between the exit pupil of the imaging lens and the incident pupil of the image sensor. In addition, the positional shift between a microlens and divided photo-electric conversion portions or between a microlens and a light-shielding layer having an opening due to mass-production variations causes a pupil shift between the exit pupil of the imaging lens and the incident pupil of the image sensor. In focus detection using the imaging plane phase-difference method, as a pupil shift occurs, the asymmetry of the respective partial pupil areas having undergone pupil division increases, resulting in a deterioration in focus detection accuracy.

Japanese Patent Laid-Open No. 2009-15164 discloses a technique of coping with a pupil shift by arranging a plurality of focus detecting pixels shifted from each other by different shift amounts for positioning between microlenses and divided photo-electric conversion portions. This technique performs focus detection using the imaging plane phase-difference method by selecting focus detecting pixels which minimize the asymmetry of the respective partial pupil areas having undergone pupil division in accordance with the imaging lens and the image height for focus detection.

In an actual image sensor, however, since each pixel has a finite size, there is an upper limit on the shift amount by which divided photo-electric conversion portions or light-shielding layers having openings are shifted inside pixels. This makes it impossible to cope with a pupil shift at the peripheral image height of the image sensor, resulting in a deterioration in focus detection accuracy. This then limits the image height range in which the pupil division phase-difference method can perform focus detection.

SUMMARY OF THE INVENTION

The present invention has been made in consideration of the above problem, and enlarges the image height range in which focus detection can be performed in focus detection on an imaging plane by using the pupil division phase-difference method.

According to the first aspect of the present invention, there is provided an image sensor comprising: a plurality of image forming pixels which receive light beams passing through an imaging pupil area of an imaging optical system; a plurality of first focus detecting pixels which receive light beams passing through a first pupil area smaller than the imaging pupil area; and a plurality of second focus detecting pixels which receive light beams passing through a second pupil area smaller than the imaging pupil area, wherein a geometric centre of the first pupil area differs from a geometric centre of the second pupil area, and eccentricity of a lens of the first focus detecting pixel relative to a center of the pixel differs from eccentricity of a lens of an image forming pixel adjacent to the first focus detecting pixel relative to a center of the pixel, the first focus detecting pixel comprising a first light-shielding layer having a first opening between the lens of the first focus detecting pixel and a photo-electric conversion portion of the first focus detecting pixel, the second focus detecting pixel comprising a second light-shielding layer having a second opening between the lens of the second focus detecting pixel and a photo-electric conversion portion of the second focus detecting pixel, and a direction of eccentricity of each of lenses of the first focus detecting pixel and the second focus detecting pixel relative to a center of each of the pixels being opposite to a direction of eccentricity of an average position of a geometric centre of the first opening and a geometric centre of the second opening relative to a center of the pixel.

According to the second aspect of the present invention, there is provided an image sensor comprising a plurality of image forming pixels which receive light beams passing through an imaging pupil area of an imaging optical system, a plurality of first focus detecting pixels which receive light beams passing through a first pupil area smaller than the imaging pupil area, and a plurality of second focus detecting pixels which receive light beams passing through a second pupil area smaller than the imaging pupil area, wherein the plurality of image forming pixels are arrayed in a first direction perpendicular to an optical axis of the imaging optical system, the plurality of first focus detecting pixels are arrayed in the first direction so as to shift from the plurality of image forming pixels in a second direction perpendicular to the first direction and a direction of the optical axis, the plurality of second focus detecting pixels are arrayed in the first direction so as to shift from the plurality of image forming pixels in the second direction, the first focus detecting pixel comprises a first light-shielding layer having a first opening between a lens of the first focus detecting pixel and a photo-electric conversion portion of the first focus detecting pixel, the second focus detecting pixel comprises a second light-shielding layer having a second opening located at a position different from a position of the first opening in the first direction between a lens of the second focus detecting pixel and a photo-electric conversion portion of the second focus detecting pixel, an average position of a geometric centre of the first opening and a geometric centre of the second opening is eccentric with respect to a geometric centre of a photo-electric conversion portion of the first focus detecting pixel in the first direction, eccentricity of a lens of the first focus detecting pixel relative to a center of the pixel differs from eccentricity of a lens of the image forming pixel relative to a center of the pixel in the first direction at the same image height in the first direction, eccentricity of a lens of the second focus detecting pixel relative to a center of the pixel differs from eccentricity of a lens of the image forming pixel relative to a center of the pixel in the first direction at the same image height in the first direction, and a direction of eccentricity of each of lenses of the first focus detecting pixel and the second focus detecting pixel relative to a center of the pixel in the first direction is opposite to a direction of eccentricity of an average position of a geometric centre of the first opening and a geometric centre of the second opening relative to a center of the pixel.

According to the third aspect of the present invention, there is provided an image capturing apparatus as specified above.

Further features of the present invention will become apparent from the following description of exemplary embodiments with reference to the attached drawings.

BRIEF DESCRIPTION OF THE DRAWINGS

FIGS. 3A and 3B are respectively a schematic plan view and a schematic sectional view showing the first focus detecting pixel in arrangement 1 in the first embodiment;

FIGS. 6A to 6C are schematic views for explaining pupil division in arrangement 1 in the first embodiment;

FIGS. 7A and 7B are respectively a schematic plan view and a schematic sectional view showing the first focus detecting pixel in arrangement 2 in the first embodiment;

FIGS. 8A and 8B are respectively a schematic plan view and a schematic sectional view showing the second focus detecting pixel in arrangement 2 in the first embodiment;

FIGS. 9A to 9C are schematic views for explaining pupil division in arrangement 2 in the first embodiment;

FIGS. 12A to 12C are schematic views for explaining pupil division in arrangement 3 in the first embodiment;

FIGS. 13A to 13C are schematic views for explaining a pupil shift;

FIGS. 15A and 15B are respectively a schematic plan view and a schematic sectional view showing the first focus detecting pixel in arrangement 1 in the second embodiment;

FIGS. 18A and 18B are respectively a schematic plan view and a schematic sectional view showing the first focus detecting pixel in arrangement 2 in the second embodiment; and FIGS. 19A and 19B are respectively a schematic plan view and a schematic sectional view showing the second focus detecting pixel in arrangement 2 in the second embodiment.

DESCRIPTION OF THE EMBODIMENTS

The embodiments of the present invention will be described in detail below with reference to the accompanying drawings.

First Embodiment

Overall Arrangement

Figure 1:
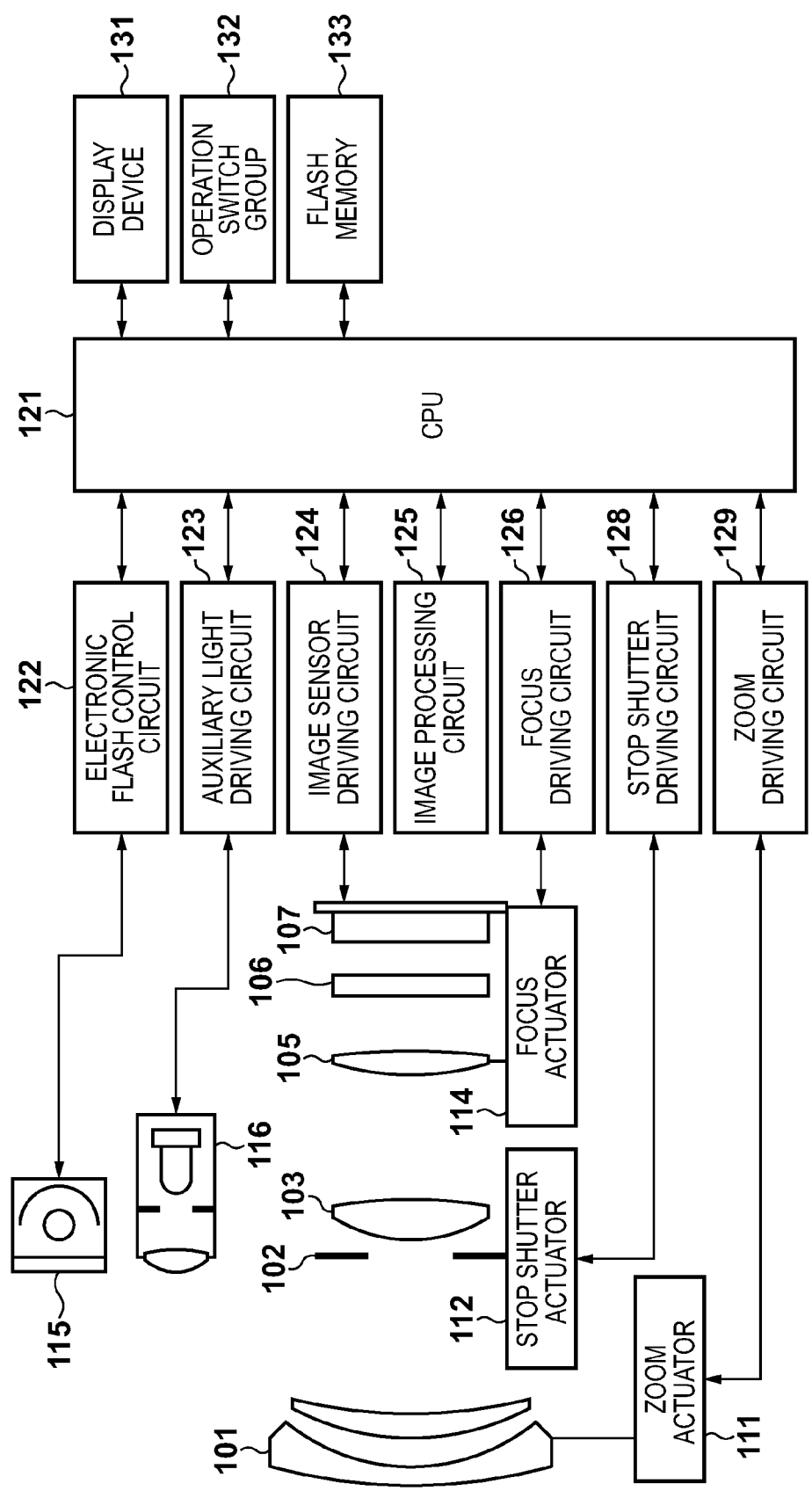
FIG. 1 is a block diagram showing the schematic arrangement of an image capturing apparatus according to an embodiment of the present invention.

FIG. 1 is a block diagram showing the arrangement of an image capturing apparatus as a camera which includes an image sensor according to the first embodiment of the present invention. Referring to FIG. 1, reference numeral 101 denotes a first lens group which is disposed at the distal end of an imaging optical system and is held so as to be movable forward and backward in the optical axis direction; 102, a stop/shutter which performs light amount adjustment at the time of imaging by adjusting the opening diameter and also functions as an exposure time adjustment shutter at the time of still image capturing; and 103, a second lens group. The stop/shutter 102 and the second lens group 103 integrally move forward and backward in the optical axis direction to implement a variable power effect (zoom function) interlockingly with the forward/backward movement of the first lens group 101.

Reference numeral 105 denotes a third lens group which moves backward and forward in the optical axis direction to perform focus adjustment; 106, an optical low-pass filter which is an optical element for reducing the false color or moire of a captured image; and 107, an image sensor constituted by a two-dimensional CMOS photosensor and peripheral circuits.

Reference numeral 111 denotes a zoom actuator which makes a cam cylinder (not shown) pivot to drive the first lens group 101, the second lens group 103, and the third lens group 105 forward and backward in the optical axis direction so as to perform variable power operation. Reference numeral 112 denotes a stop shutter actuator which adjusts an imaging light amount by controlling the opening diameter of the stop/shutter 102 and controls an exposure time at the time of still image capturing. Reference numeral 114 denotes a focus actuator which performs focus adjustment by driving the third lens group 105 forward and backward in the optical axis direction.

Reference numeral 115 denotes an electronic flash for illuminating an object at the time of imaging. As this flash, a flash illumination device using a xenon tube is suitably used. However, an illumination device including an LED which continuously emits light may be used. Reference numeral 116 denotes an AF auxiliary light device which projects an image of a mask having a predetermined opening pattern on a field through a projection lens and improves the focus detection performance for a dark object or a low-contrast object.

Reference numeral 121 denotes a CPU in the camera which performs various types of control on the camera main body and includes a computing unit, ROM, RAM, A/D converter, D/A converter, and communication interface circuit. The CPU 121 drives various types of circuits of the camera based on predetermined programs stored in the ROM to execute a series of operations including AF, imaging, image processing, and recording.

Reference numeral 122 denotes an electronic flash control circuit which ON/OFF-controls the electronic flash 115 in synchronism with imaging operation; 123, an auxiliary light driving circuit which ON/OFF-controls the AF auxiliary light device 116 in synchronism with focus detecting operation; 124, an image sensor driving circuit which controls the imaging operation of the image sensor 107 and transmits the acquired image signal to the CPU 121 upon A/D-converting the signal; and 125, an image processing circuit which performs processing such as γ conversion, color interpolation, and JPEG compression for the image acquired by the image sensor 107.

Reference numeral 126 denotes a focus driving circuit which drives/controls the focus actuator 114 based on a focus detection result to perform focus adjustment by driving the third lens group 105 forward and backward in the optical axis direction; 128, a stop shutter driving circuit which drives/controls the stop shutter actuator 112 to control the opening of the stop/shutter 102; and 129, a zoom driving circuit 129 which drives the zoom actuator 111 in accordance with the zooming operation performed by the operator.

Reference numeral 131 denotes a display device such as an LCD which displays information concerning the imaging modes of the camera, a preview image before imaging, a check image after imaging, an in-focus state display image at the time of focus detection, and the like; 132, an operation switch group constituted by a power switch, release (imaging trigger) switch, zoom operation switch, imaging mode selection switch, and the like; and 133, a detachable flash memory which records a captured image.

[Image Sensor]

Figure 2:
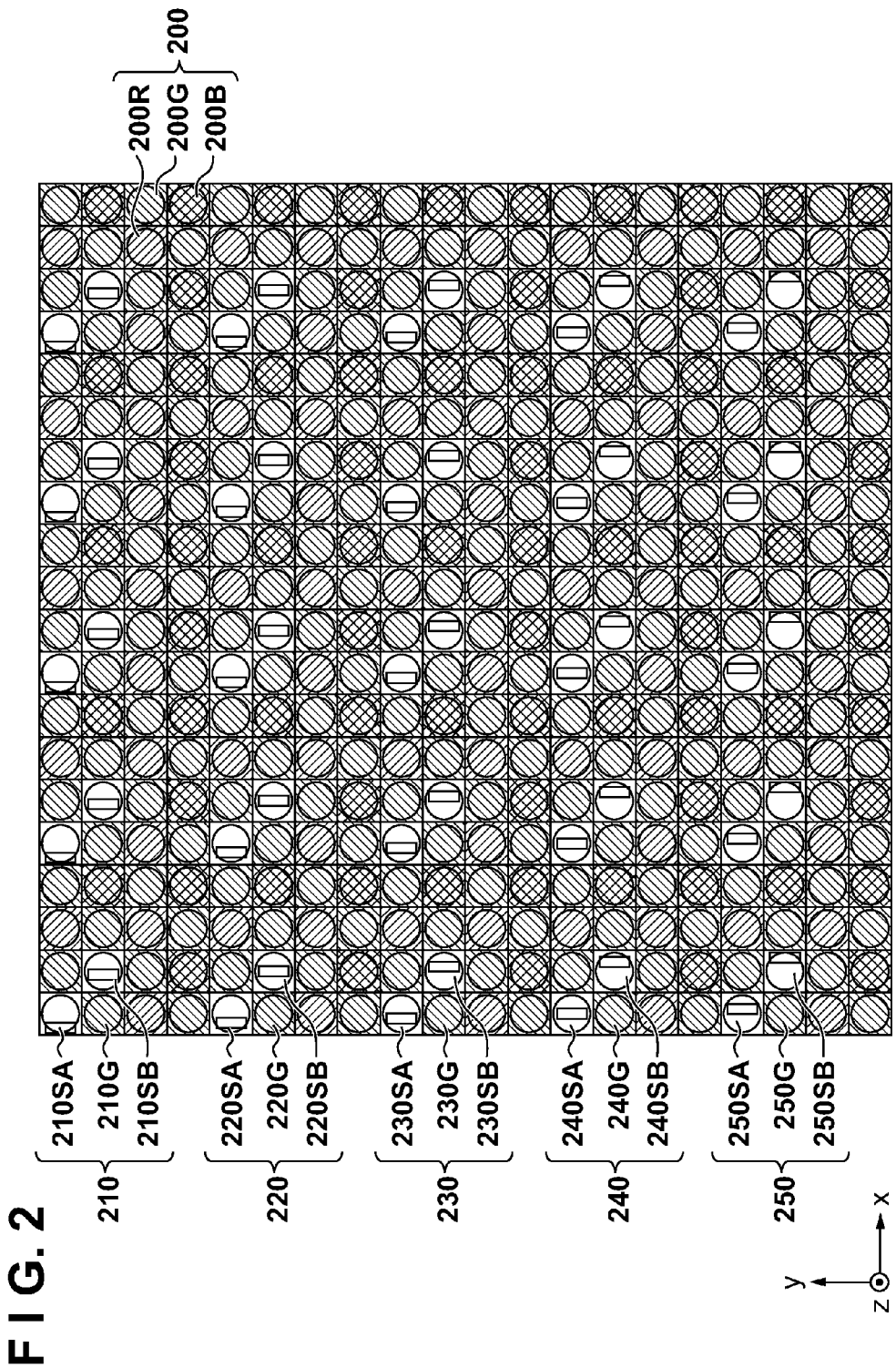
FIG. 2 is a schematic view of a pixel array in the embodiment of the present invention.

FIG. 2 is a schematic view showing the pixel array of the image sensor in the first embodiment. FIG. 2 shows the pixel array of a two-dimensional CMOS sensor (image sensor) in the first embodiment within the range of 20 (columns)×20 (rows) pixels. Many arrays of 20 (columns)×20 (rows) pixels shown in FIG. 2 are arranged on a surface to allow acquisition of a high-resolution image. This embodiment will exemplify an image sensor with a pixel pitch of 4 µm, an effective pixel count of horizontal 5575 columns×vertical 3725 rows=about 20000000 pixels, and an imaging screen size of 22.3 mm (horizontal)×14.9 mm (vertical).

In this embodiment, a 2 (rows)×2 (columns) focus detecting pixel group 200 shown in FIG. 2 includes a pixel 200R having R (Red) spectral sensitivity and located on the upper left, pixels 200G having G (Green) spectral sensitivity and located on the upper right and the lower left, and a pixel 200B having B (Blue) spectral sensitivity and located on the lower right. A 2 (rows)×2 (columns) pixel group 210 (220, 230, 240, or 250) shown in FIG. 2 includes two image forming pixels 210G (220G, 230G, 240G, or 250G) having G spectral sensitivity and located on the upper right and the lower left. This pixel group also includes a first focus detecting pixel 210SA (220SA, 230SA, 240SA, or 250SA) having W (White) spectral sensitivity and located on the upper left and a second focus detecting pixel 210SB (220SB, 230SB, 240SB, or 250SB) having W spectral sensitivity and located on the lower right.

[Arrangement 1]

Figure 4A:
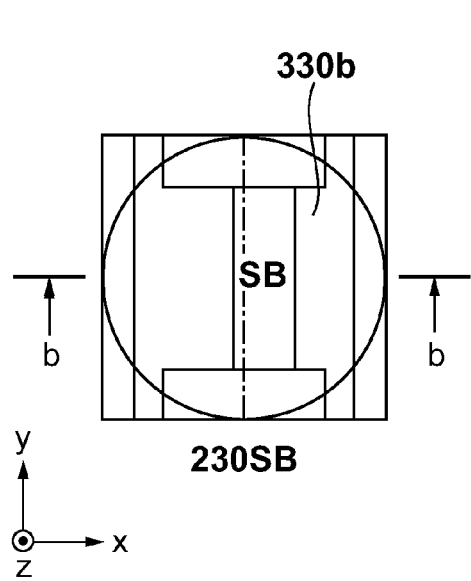
FIGS. 4A and 4B are respectively a schematic plan view and a schematic sectional view showing the second focus detecting pixel in arrangement 1 in the first embodiment.
Figure 4B:
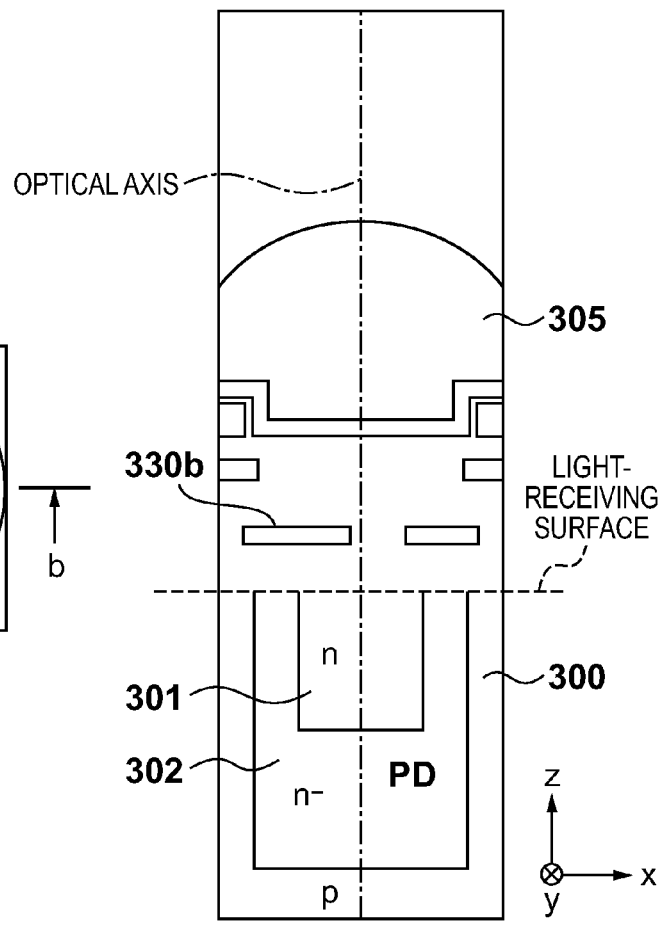
Figure 5A:
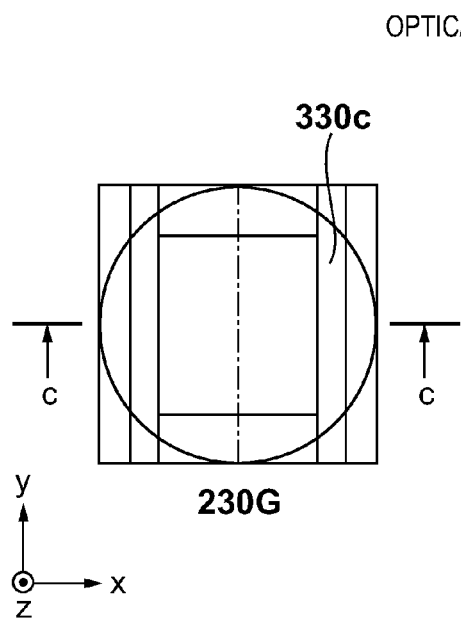
FIGS. 5A and 5B are respectively a schematic plan view and a schematic sectional view showing an image forming pixel in the first embodiment.
Figure 5B:
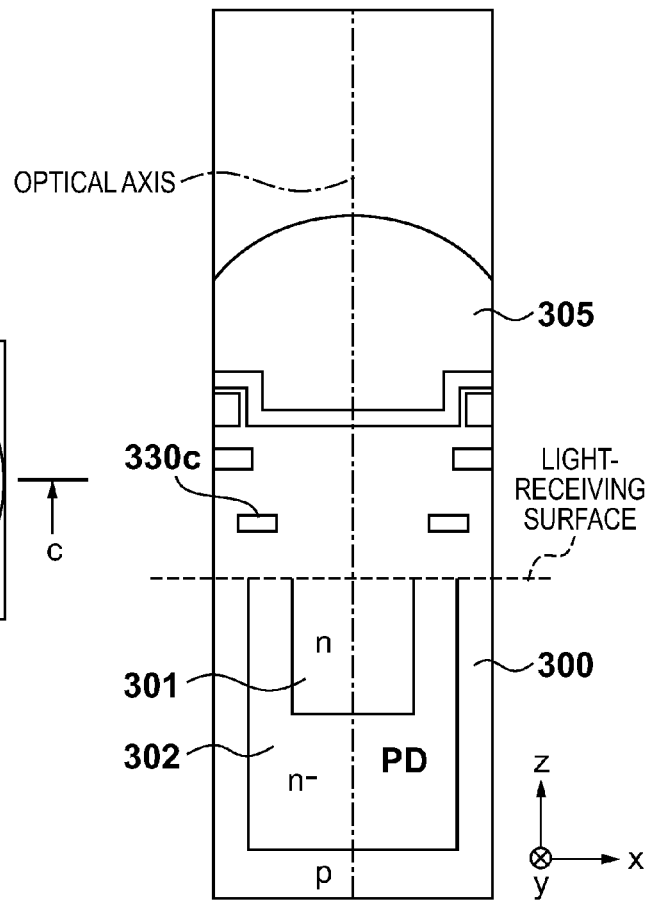

The focus detecting pixel group 230 in arrangement 1 will be described below. FIG. 3A is a plan view of the first focus detecting pixel 230SA as one pixel of the image sensor shown in FIG. 2 when viewed from the light-receiving surface side (+z side) of the image sensor. FIG. 3B is a sectional view taken along a-a in FIG. 3A when viewed from the −y side. FIG. 4A is a plan view of the second focus detecting pixel 230SB as one pixel of the image sensor shown in FIG. 2 when viewed from the light-receiving surface side (+z side) of the image sensor. FIG. 4B is a sectional view taken along b-b in FIG. 4A when viewed from the −y side. FIG. 5A is a plan view of the first image forming pixel 230G as one pixel of the image sensor shown in FIG. 2 when viewed from the light-receiving surface side (+z side) of the image sensor. FIG. 5B is a sectional view taken along c-c in FIG. 5A when viewed from the −y side.

As shown in FIGS. 3A to 5B, in each of the first focus detecting pixel 230SA, the second focus detecting pixel 230SB, and the image forming pixel 230G in this embodiment, a photodiode (photo-electric conversion portion) PD having a pin structure is formed, in which a p-type layer 300 and an n-type layer 301 sandwich an n-intrinsic layer 302. The region of the photo-electric conversion portion PD is equivalent to the region of a depletion layer formed in the n-intrinsic layer 302 and its surrounding region extending by the distance that minority carriers diffuse, and almost overlaps the total region of the n-intrinsic layer 302 and n-type layer 301. The n-intrinsic layer 302 may be omitted to form a p-n junction photodiode, as needed. A microlens 305 for focusing incident light is formed on the light-receiving side of each pixel.

In the first focus detecting pixel 230SA shown in FIGS. 3A and 3B, a first light-shielding layer 330a having a first opening is formed between the microlens 305 and the photo-electric conversion portion PD, with the geometric centre of the first opening being eccentric with respect to the geometric centre of the photo-electric conversion portion in the −x direction.

In the second focus detecting pixel 230SB shown in FIGS. 4A and 4B, a second light-shielding layer 330b having the second opening is formed between the microlens 305 and the photo-electric conversion portion PD, with the geometric centre of the second opening being eccentric with respect to the geometric centre of the light-receiving surface of the photo-electric conversion portion in the +x direction.

In arrangement 1, the geometric centre of the first opening of the first light-shielding layer 330a differs from the geometric centre of the second opening of the second light-shielding layer 330b. In addition, the average position of the geometric centre of the first opening of the first light-shielding layer 330a and the geometric centre of the second opening of the second light-shielding layer 330b is made to almost coincide with the geometric centre of the light-receiving surface of the photo-electric conversion portion.

This embodiment forms the first light-shielding layer having the first opening and the second light-shielding layer having the second opening by using wiring layers for driving the image sensor. That is, the formed layers serve as both the wiring layers and the light-shielding layers.

In this embodiment, the first focus detecting pixel has the first light-shielding layer having the first opening between the microlens of the first focus detecting pixel and the photo-electric conversion portion of the first focus detecting pixel. In addition, the second focus detecting element includes the second light-shielding layer having the second opening between the microlens of the second focus detecting pixel and the photo-electric conversion portion of the second focus detecting pixel.

The microlens 305 focuses light entering the first focus detecting pixel 230SA (second focus detecting pixel 230SB) shown in FIGS. 3A and 3B (FIGS. 4A and 4B). Part of the focused light passes through the first opening (second opening) of the first light-shielding layer 330a (second light-shielding layer 330b) and is received by the photo-electric conversion portion PD. The photo-electric conversion portion PD generates electron-hole pairs in accordance with the amount of light received, and dissociates them through a depletion layer. The photo-electric conversion portion PD then accumulates the negatively charged electrons in the n-type layer 301 while discharging the holes outside the image sensor through the p-type layer 300 connected to a constant voltage source (not shown).

In contrast to a focus detecting pixel, in the image forming pixel 230G shown in FIGS. 5A and 5B, a wiring layer 330c is formed on only a peripheral portion of the pixel, and no light-shielding layer is formed in the middle portion of the pixel. A G (Green) color filter (not shown) is formed between the microlens 305 and the photo-electric conversion portion PD.

FIGS. 6A to 6C are schematic views showing the correspondence relationship between pupil division and the opening of the light-shielding layer formed on a pixel with arrangement 1. FIG. 6A is a sectional view of the first focus detecting pixel 230SA taken along a-a in FIG. 3A when viewed from the +y side and shows the exit pupil plane of the imaging optical system. FIG. 6B is a sectional view of the second focus detecting pixel 230SB taken along b-b in FIG. 4A when viewed from the +y side and shows the exit pupil plane of the imaging optical system. FIG. 6C is a sectional view of the image forming pixel 230G taken along c-c in FIG. 5A when viewed from the +y side and shows the exit pupil plane of the imaging optical system. To match with the coordinate axes of the exit pupil plane in each of FIGS. 6A to 6C, the x- and y-axes of the sectional view are inverted with respect to each of FIGS. 3A to 5B.

Referring to FIGS. 6A to 6C, reference numeral 400 denotes the exit pupil of the imaging optical system; 500, the pupil intensity distribution (imaging pupil area) of the image forming pixel 230G; 530a, the pupil intensity distribution (first pupil area) of the first focus detecting pixel 230SA; and 530b, the pupil intensity distribution (second pupil area) of the second focus detecting pixel 230SB. Note that reference symbol PD denotes a photo-electric conversion portion. A light beam from an object passes through the exit pupil 400 of the imaging optical system and enters each pixel.

Referring to FIG. 6C, the imaging pupil area 500 of the image forming pixel is almost conjugate to the light-receiving surface of the photo-electric conversion portion PD through the microlens, and represents a pupil area which can receive light through the image forming pixels. The pupil distance is several 10 mm, whereas the diameter of the microlens is several μm. The aperture value of the microlens is therefore several ten thousands, and hence diffraction blurring occurs at several 10 mm level. For this reason, an image on the light-receiving surface of the photo-electric conversion portion PD is not a clear area but represents a light reception ratio distribution.

The imaging pupil area 500 of the image forming pixel is maximized to receive a large amount of light beam passing through the exit pupil 400 of the imaging optical system. In addition, the geometric centre of the imaging pupil area 500 almost coincides with the optical axis of the imaging optical system at a predetermined pupil distance.

Referring to FIG. 6A, in the first pupil area 530a of the first focus detecting pixel 230SA, the geometric centre of the first light-shielding layer 330a is almost conjugate to the first opening eccentric in the −x direction through the microlens. FIG. 6A also shows a pupil area which can receive light through the first focus detecting pixel 230SA. The first pupil area 530a of the first focus detecting pixel 230SA is smaller than the imaging pupil area 500 of the image forming pixel and has a geometric centre eccentric to the +X side on the pupil plane.

Referring to FIG. 6B, in the second pupil area 530b of the second focus detecting pixel 230SB, the geometric centre of the second light-shielding layer 330b is almost conjugate to the second opening eccentric in the +x direction through the microlens. FIG. 6B also shows a pupil area which can receive light through the second focus detecting pixel 230SB. The second pupil area 530b of the second focus detecting pixel 230SB is smaller than the imaging pupil area 500 of the image forming pixel and has a geometric centre eccentric to the −X side on the pupil plane.

The geometric centre of the first pupil area 530a of the first focus detecting pixel 230SA and the geometric centre of the second pupil area 530b of the second focus detecting pixel 230SB differ from each other and are eccentric in the opposite directions. This makes it possible to perform pupil division for the exit pupil 400 of the imaging optical system in the X direction. Likewise, making the geometric centre of the first opening of the first light-shielding layer eccentric in the −y direction and the geometric centre of the second opening of the second light-shielding layer eccentric in the +y direction can perform pupil division for the exit pupil 400 of the imaging optical system in the Y direction.

In arrangement 1, the geometric centre of the first pupil area 530a differs from the geometric centre of the second pupil area 530b. In addition, the average of the geometric centre of the first pupil area 530a and the geometric centre of the second pupil area 530b almost coincides with the geometric centre of the imaging pupil area 500 at a predetermined pupil distance.

The image sensor of this embodiment includes a plurality of image forming pixels which receive light beams passing through the imaging pupil area of the imaging optical system, a plurality of first focus detecting pixels which receive light beams passing through the first pupil area smaller than the imaging pupil area, and a plurality of second focus detecting pixels which receive light beams passing through the second pupil area smaller than the imaging pupil area, and is configured such that the geometric centre of the first pupil area differs from the geometric centre of the second pupil area.

[Arrangement 2]

The focus detecting pixel group 220 in arrangement 2 will be described below. FIG. 7A is a plan view of the first focus detecting pixel 220SA as one pixel of the image sensor shown in FIG. 2 when viewed from the light-receiving surface side (+z side) of the image sensor. FIG. 7B is a sectional view taken along a-a in FIG. 7A when viewed from the −y side. FIG. 8A is a plan view of the second focus detecting pixel 220SB as one pixel of the image sensor shown in FIG. 2 when viewed from the light-receiving surface side (+z side) of the image sensor. FIG. 8B is a sectional view taken along b-b in FIG. 8A when viewed from the −y side. The image forming pixel 220G is the same as the first image forming pixel 230G in arrangement 1.

In arrangement 2, the geometric centre of the first opening of a first light-shielding layer 320a of the first focus detecting pixel 220SA differs from the geometric centre of the second opening of a second light-shielding layer 320b of the second focus detecting pixel 220SB. In addition, the average position of the geometric centre of the first opening of the first light-shielding layer 320a and the geometric centre of the second opening of the second light-shielding layer 320b is eccentric with respect to the geometric centre of the light-receiving surface of the photo-electric conversion portion in the −x direction.

In contrast to this, the first focus detecting pixel 240SA and second focus detecting pixel 240SB of the focus detecting pixel group 240 shown in FIG. 2 are configured such that the average position of the geometric centre of the first opening of the first light-shielding layer and the geometric centre of the second opening of the second light-shielding layer is eccentric with respect to the geometric centre of the light-receiving surface of the photo-electric conversion portion in the +x direction.

FIGS. 9A to 9C are schematic views for explaining the correspondence relationship between pupil division and the opening of the light-shielding layer formed on a pixel in arrangement 2. FIG. 9A is a sectional view of the first focus detecting pixel 220SA taken along a-a in FIG. 7A when viewed from the +y side. FIG. 9B is a sectional view of the second focus detecting pixel 220SB taken along b-b in FIG. 8A when viewed from the +y side, and shows the exit pupil plane of the imaging optical system. To match with the coordinate axes of the exit pupil plane in each of FIGS. 9A to 9C, the x- and y-axes of the sectional view are inverted with respect to each of FIGS. 7A to 8B.

In arrangement 2, the geometric centre of a first pupil area 520a of the first focus detecting pixel 220SA differs from a second pupil area 520b of the second focus detecting pixel 220SB. The average of the geometric centre of the first pupil area 520a and the geometric centre of the second pupil area 520b is eccentric to the +X side with respect to the geometric centre of the imaging pupil area 500 at a predetermined pupil distance.

In contrast to this, the first focus detecting pixel 240SA and second focus detecting pixel 240SB of the focus detecting pixel group 240 shown in FIG. 2 are configured such that the average of the geometric centre of the first pupil area and the geometric centre of the second pupil area is eccentric to the −X side with respect to the geometric centre of the imaging pupil area 500 at a predetermined pupil distance.

[Arrangement 3]

Figures 10A, 10B:
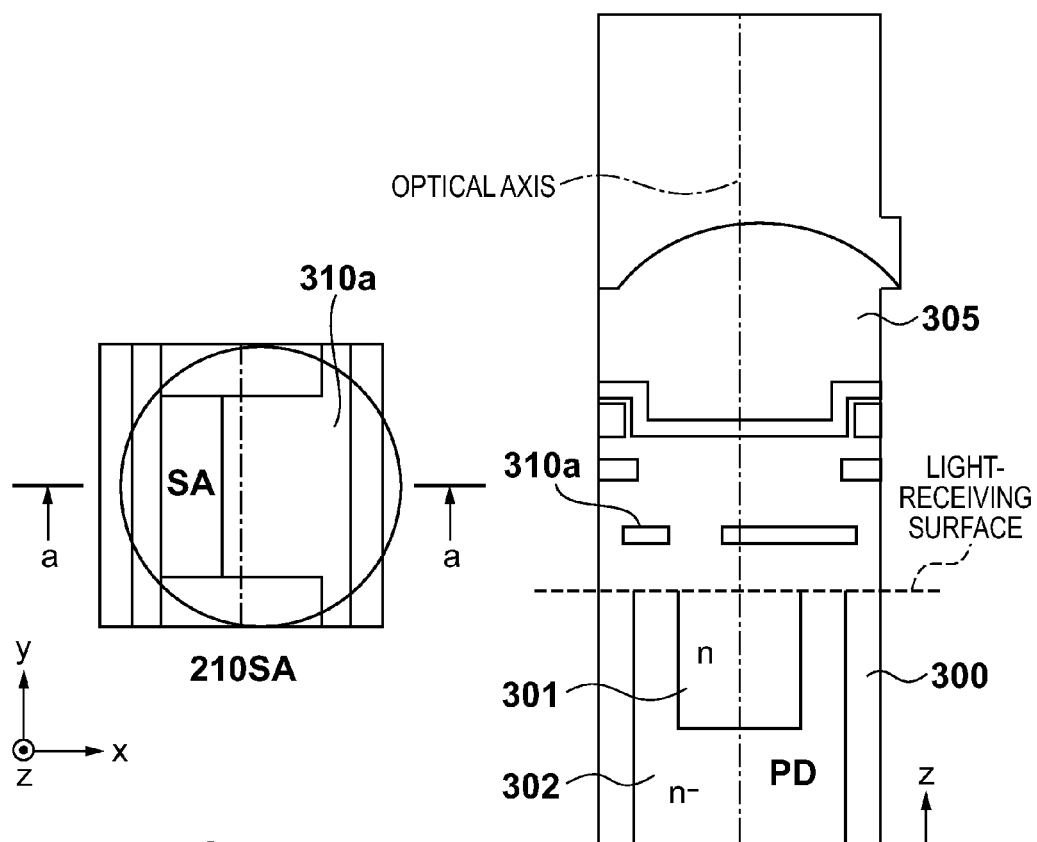
FIGS. 10A and 10B are respectively a schematic plan view and a schematic sectional view showing the first focus detecting pixel in arrangement 3 in the first embodiment.
Figure 11A:
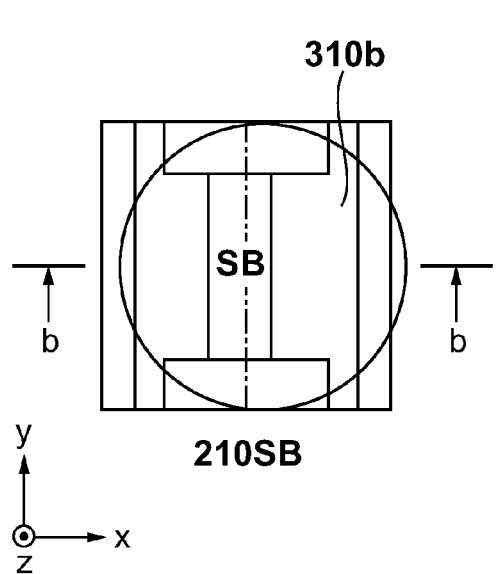
FIGS. 11A and 11B are respectively a schematic plan view and a schematic sectional view showing the second focus detecting pixel in arrangement 3 in the first embodiment.
Figure 11B:
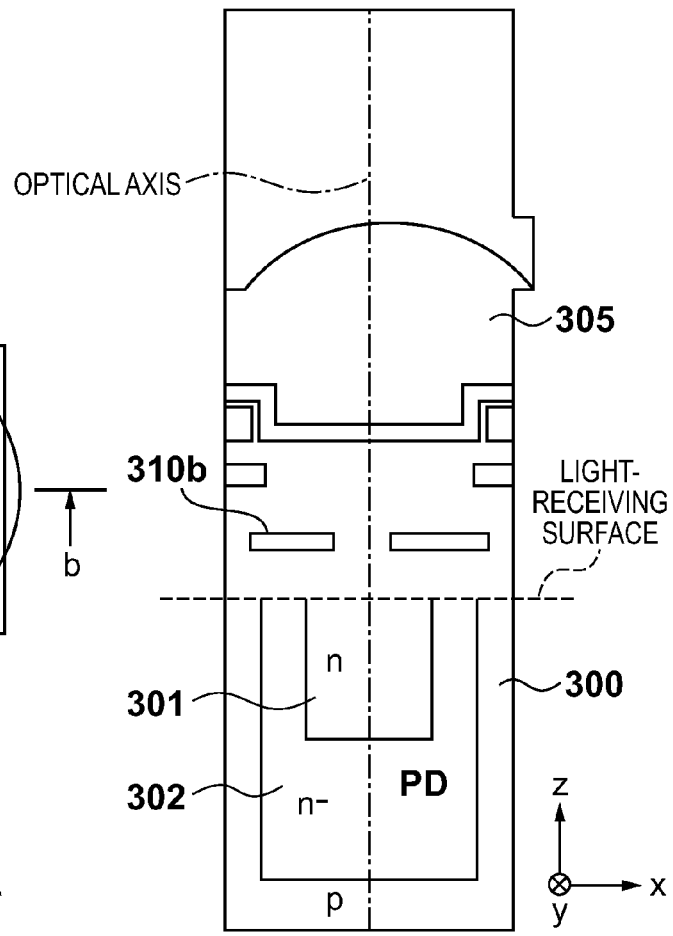

The focus detecting pixel group 210 in arrangement 3 will be described below. FIG. 10A is a plan view showing the first focus detecting element 210SA as one pixel of the image sensor shown in FIG. 2 when viewed from the light-receiving surface side (+z side) of the image sensor. FIG. 10B is a sectional view taken along a-a in FIG. 10A when viewed from the −y side. FIG. 11A is a plan view showing the second focus detecting element 210SB as one pixel of the image sensor shown in FIG. 2 when viewed from the light-receiving surface side (+z side) of the image sensor. FIG. 11B is a sectional view of the second focus detecting element 210SB taken along b-b in FIG. 11A when viewed from the −y side. The image forming pixel 210G is the same as the first image forming pixel 230G in arrangement 1.

In arrangement 3, the geometric centre of the first opening of a first light-shielding layer 310a of the first focus detecting element 210SA differs from the geometric centre of the second opening of a second light-shielding layer 310b of the second focus detecting element 210SB. The average position of the geometric centre of the first opening of the first light-shielding layer 310a and the geometric centre of the second opening of the second light-shielding layer 310b is eccentric with respect to the geometric centre of the photo-electric conversion portion in the −x direction. The microlenses of the first focus detecting element 210SA and second focus detecting element 210SB are eccentric with respect to the geometric centre of the light-receiving surface of the photo-electric conversion portion in the +x direction.

In contrast to this, the first focus detecting element 250SA and second focus detecting element 250SB of the focus detecting element group 250 shown in FIG. 2 are configured such that the average position of the geometric centre of the first opening of the first light-shielding layer and the geometric centre of the second opening of the second light-shielding layer is eccentric with respect to the geometric centre of the light-receiving surface of the photo-electric conversion portion in the +x direction. The microlenses of the first focus detecting element 250SA and second focus detecting element 250SB are eccentric with respect to the geometric centre of the light-receiving surface of the photo-electric conversion portion in the −x direction.

The microlenses of the first focus detecting element and second focus detecting element are eccentric in a direction opposite to the direction in which the average position of the geometric centre of the first opening and the geometric centre of the second opening is eccentric.

Since the first light-shielding layer 310a of the first focus detecting element 210SA in this embodiment is formed from a wiring layer for driving the image sensor, the first opening of the first light-shielding layer 310a cannot be made further eccentric in the −x direction. Instead of this, the microlens of the first focus detecting element 210SA is made eccentric in the +x direction as the opposite direction. It is possible to further increase the eccentricity amount of the first opening of the first light-shielding layer 310a with respect to the microlens of the first focus detecting element 210SA as compared with that in arrangement 2. The microlens of the image forming pixel 210G is the same as that in arrangement 1.

The first focus detecting element 210SA and the image forming pixel 210G constituting the pixel group 210 are adjacent to each other, as shown in FIG. 2. The eccentricity of the microlens of the first focus detecting element 210SA shown in FIGS. 10A and 10B differs from the eccentricity of the microlens of the image forming pixel 210G shown in FIG. 5. Likewise, the second focus detecting element 210SB and the image forming pixel 210G constituting the pixel group 210 are adjacent to each other, as shown in FIG. 2. The eccentricity of the microlens of the second focus detecting element 210SB shown in FIGS. 11A and 11B differs from the eccentricity of the microlens of the image forming pixel 210G shown in FIGS. 5A and 5B.

In this embodiment, therefore, the eccentricity of the microlens of the first focus detecting element 210SA differs from the eccentricity of the microlens of the adjacent image forming pixel 210G in this embodiment. In addition, the eccentricity of the microlens of the second focus detecting element 210SB differs from the eccentricity of the microlens of the adjacent image forming pixel 210G.

FIGS. 12A to 12C are schematic views showing the correspondence relationship between pupil division and the opening of the light-shielding layer formed on the pixel in arrangement 3. FIG. 12A is a sectional view of the first focus detecting element 210SA taken along a-a in FIG. 10A when viewed from the +y side, and shows the exit pupil plane of the imaging optical system. FIG. 12B is a sectional view of the second focus detecting element 210SB taken along b-b in FIG. 11A when viewed from the +y side, and shows the exit pupil plane of the imaging optical system. To match with the coordinate axes of the exit pupil plane in each of FIGS. 12A to 12C, the x- and y-axes of the sectional view are inverted with respect to each of FIGS. 10A to 11B.

In arrangement 3, the geometric centre of a first pupil area 510a of the first focus detecting element 210SA differs from the geometric centre of a second pupil area 510b of the second focus detecting element 210SB. The average of the geometric centre of the first pupil area 510a and the geometric centre of the second pupil area 510b is eccentric to the +X side with respect to the geometric centre of the imaging pupil area 500 at a predetermined pupil distance.

In contrast to this, the first focus detecting element 250SA and second focus detecting element 250SB of the focus detecting element group 250 shown in FIG. 2 are configured such that the average of the geometric centre of the first pupil area and the geometric centre of the second pupil area is eccentric to the −X side with respect to the geometric centre of the imaging pupil area 500 at a predetermined pupil distance.

[Focus Detection]

The first focus detecting elements 210SA (220SA, 230SA, 240SA, or 250SA) shown in FIG. 2 are regularly arrayed in the x direction, and the object image acquired from the plurality of first focus detecting pixels will be referred to as an image A. Likewise, the second focus detecting elements 210SB (220SB, 230SB, 240SB, or 250SB) shown in FIG. 2 are regularly arrayed in the x direction, and the object image acquired from the plurality of second focus detecting pixels will be referred to as an image B. It is possible to perform focus detection by calculating a defocus amount (blurring amount) from the image shift amount (relative position) between the images A and B.

[Handling of Pupil Shift]

Handling of a pupil shift at the peripheral image height of the image sensor in this embodiment will be described below. FIGS. 13A to 13C, 14A, and 14B show the relationship between the first pupil area of the first focus detecting pixel, the second pupil area of the second focus detecting pixel, and the exit pupil of the imaging optical system at the peripheral image height of the image sensor.

FIG. 13A shows a case in which an exit pupil distance Dl of the imaging optical system almost coincides with a set pupil distance Ds of the image sensor. In this case, the exit pupil 400 of the imaging optical system is almost uniformly pupil-divided by the first pupil area 530a of the first focus detecting pixel 230SA and the second pupil area 530b of the second focus detecting pixel 230SB.

In contrast to this, the exit pupil 400 of the imaging optical system is non-uniformly pupil-divided at the peripheral height of the image sensor in the case shown in FIG. 13B in which the exit pupil distance Dl of the imaging optical system is shorter than the set pupil distance Ds of the image sensor or the case shown in FIG. 13C in which the exit pupil distance Dl of the imaging optical system is longer than the set pupil distance Ds of the image sensor.

As pupil division becomes non-uniform, the intensities of the images A and B (FIG. 13) become non-uniform. As a consequence, the intensity of one of the images A and B becomes larger, and the intensity of the other image becomes smaller. As the intensities of the images A and B become greatly non-uniform due to the peripheral image height and the like, one of the signals of the images A and B obtained cannot have a sufficient intensity, resulting in a deterioration in focus detection performance.

In this embodiment, the first focus detecting element 210SA and the second focus detecting element 210SB in arrangement 3 are arranged in advance, in which the average of the geometric centre of the first pupil area 510a and the geometric centre of the second pupil area 510b is greatly eccentric to the +X side with respect to the geometric centre of the imaging pupil area 500 at a predetermined pupil distance.

Figure 14A:
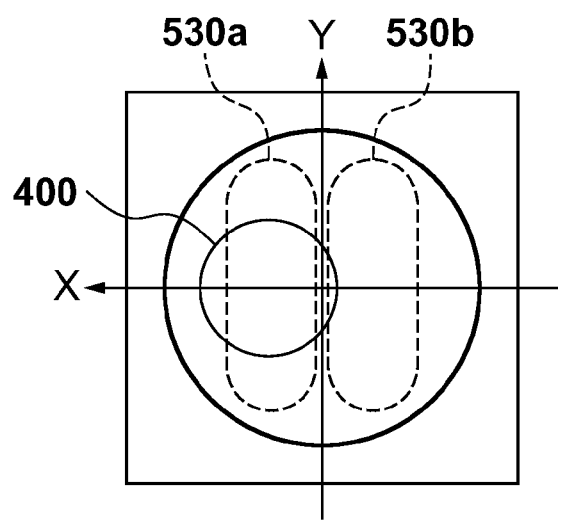
FIGS. 14A and 14B are schematic views for explaining a pupil shift.
Figure 14B:
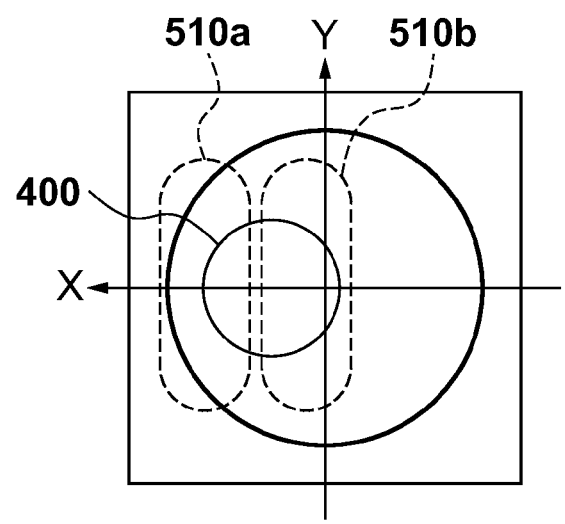

FIGS. 14A and 14B show a case in which the exit pupil distance Dl of the imaging optical system differs from the set pupil distance Ds of the image sensor, and the exit pupil 400 of the imaging optical system becomes greatly eccentric to the +X side on a pupil plane at the position corresponding to the set pupil distance Ds of the image sensor at the peripheral image height. FIG. 14A shows a case in which the exit pupil 400 of the imaging optical system which is greatly eccentric to the +X side is pupil-divided by the first pupil area 530a of the first focus detecting pixel 230SA and the second pupil area 530b of the second focus detecting pixel 230SB in arrangement 1. In this case, a pupil shift is large and non-uniform pupil division occurs. In contrast to this, FIG. 14B shows a case in which the exit pupil 400 of the imaging optical system which is eccentric to the +X side is pupil-divided by the first pupil area 510a of the first focus detecting element 210SA and the second pupil area 510b of the second focus detecting element 210SB in arrangement 3. In this case, even at the peripheral image height, a pupil shift can be reduced, and uniform pupil division can be performed. This can improve the focus detection performance.

The above arrangement can enlarge the image height range in which focus detection can be performed by the pupil division phase-difference method in accordance with a pupil shift at the peripheral height of the image sensor.

Second Embodiment

The second embodiment of the present invention will be described below.

[Arrangement 1]

Figure 16A:
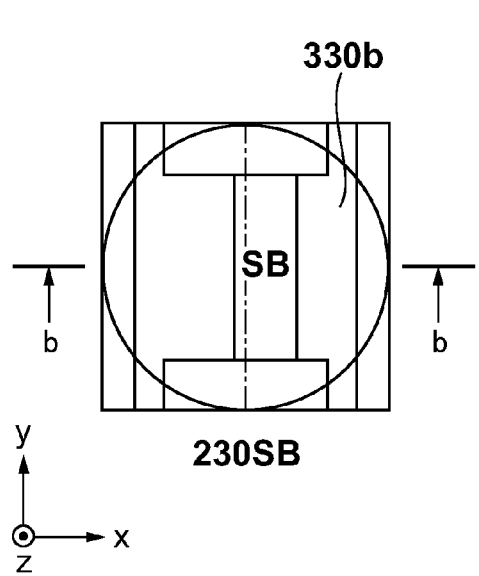
FIGS. 16A and 16B are respectively a schematic plan view and a schematic sectional view showing the second focus detecting pixel in arrangement 1 in the second embodiment.
Figure 16B:
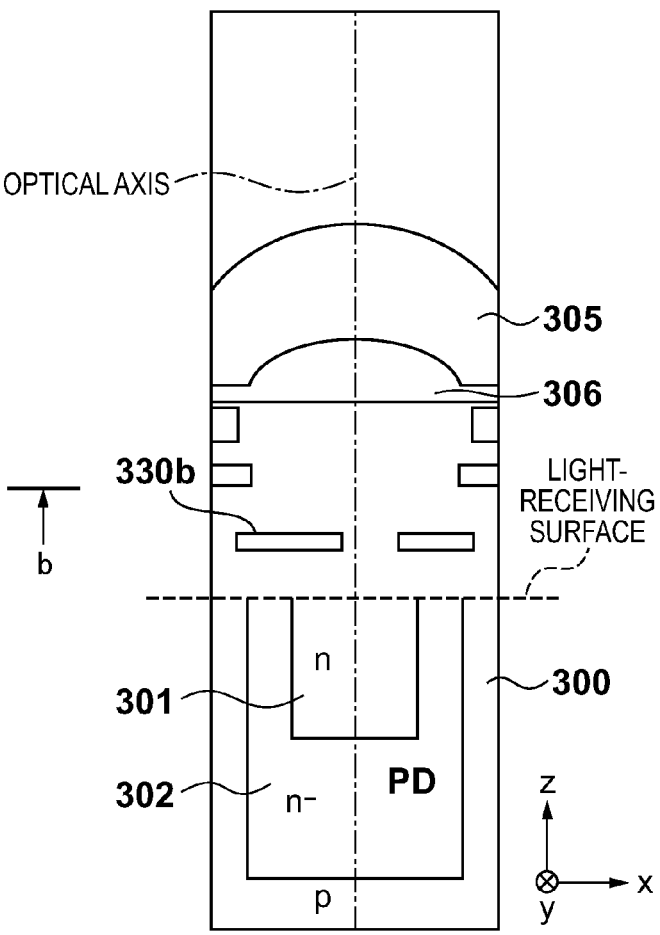
Figure 17A:
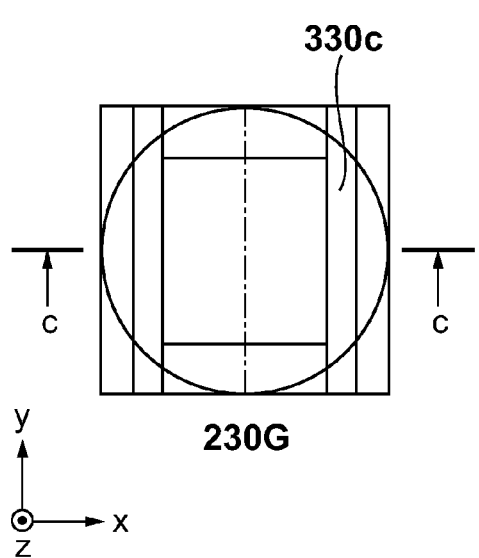
FIGS. 17A and 17B are respectively a schematic plan view and a schematic sectional view showing image forming pixel in the second embodiment.
Figure 17B:
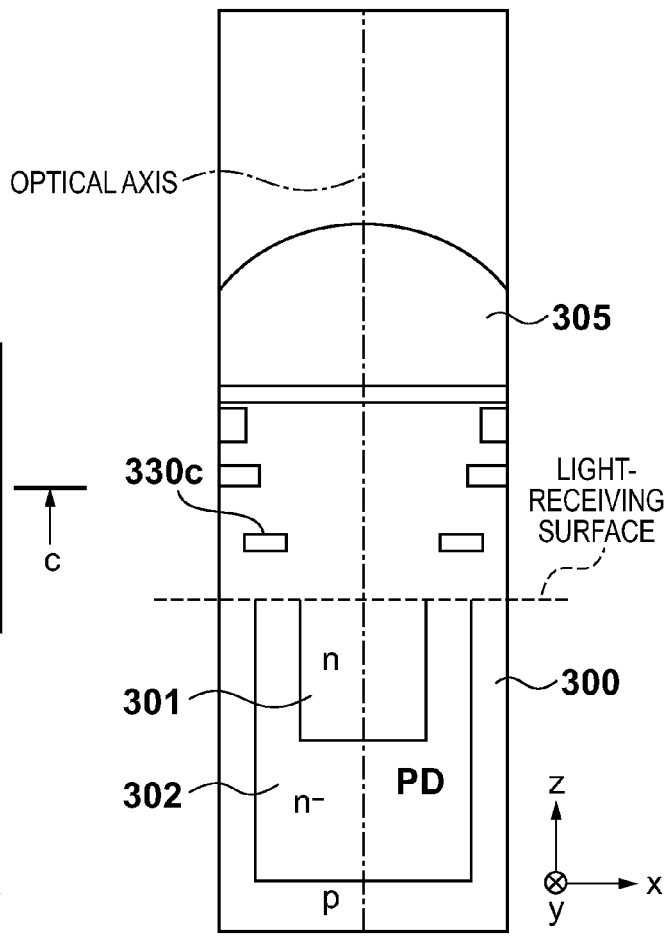

A focus detecting pixel group 230 in arrangement 1 will be described below. FIG. 15A is a plan view of a first focus detecting pixel 230SA as one pixel of the image sensor shown in FIG. 2 when viewed from the light-receiving surface side (+z side) of the image sensor. FIG. 15B is a sectional view taken along a-a in FIG. 15A when viewed from the −y side. FIG. 16A is a plan view of a second focus detecting pixel 230SB as one pixel of the image sensor shown in FIG. 2 when viewed from the light-receiving surface side (+z side) of the image sensor. FIG. 16B is a sectional view taken along b-b in FIG. 16A when viewed from the −y side. FIG. 17A is a plan view of a first image forming pixel 230G as one pixel of the image sensor shown in FIG. 2 when viewed from the light-receiving surface side (+z side) of the image sensor. FIG. 17B is a sectional view taken along c-c in FIG. 17A when viewed from the −y side.

As shown in FIG. 15B, the first focus detecting pixel 230SA has an intralayer lens 306 between a microlens 305 and a first light-shielding layer 330a having the first opening. As shown in FIG. 16B, the second focus detecting pixel 230SB has an intralayer lens 306 between a microlens 305 and a second light-shielding layer 330b having the second opening. As shown in FIG. 17B, no intralayer lens 306 is formed on the image forming pixel 230G. Other components are the same as those in arrangement 1 in the first embodiment.

[Arrangement 2]

As in arrangement 1, an intralayer lens 306 is formed on each of a first focus detecting pixel 220SA and second focus detecting pixel 220SB of a focus detecting pixel group 220 in arrangement 2. The same applies to a first focus detecting pixel 240SA and second focus detecting pixel 240SB of a focus detecting pixel group 240. Other components are the same as those in arrangement 2 in the first embodiment.

[Arrangement 3]

A focus detecting pixel group 210 in arrangement 3 will be described below. FIG. 18A is a plan view of a first focus detecting element 210SA as one pixel of the image sensor shown in FIG. 2 when viewed from the light-receiving surface side (+z side) of the image sensor. FIG. 18B is a sectional view taken along a-a in FIG. 18A when viewed from the −y side. FIG. 19A is a plan view of a second focus detecting element 210SB as one pixel of the image sensor shown in FIG. 2 when viewed from the light-receiving surface side (+z side) of the image sensor. FIG. 19B is a sectional view taken along b-b in FIG. 19A when viewed from the −y side.

As shown in FIG. 18B, in a first focus detecting element 210SA, an intralayer lens 306 is formed between a microlens 305 and a first light-shielding layer 310a having the first opening so as to be eccentric in the +x direction. The complex microlens constituted by a microlens and an intralayer lens is configured to be eccentric in the +x direction. Likewise, in the second focus detecting element 210SB, an intralayer lens 306 is formed between a microlens 305 and a second light-shielding layer 310b having the second opening so as to be eccentric in the +x direction. The complex microlens constituted by a microlens and an intralens is configured to be eccentric in the +x direction. Other components are the same as those in arrangement 3 in the first embodiment.

In arrangement 3, the geometric centre of the first opening of the first light-shielding layer 310a of the first focus detecting element 210SA differs from the geometric centre of the second opening of the second light-shielding layer 310b of the second focus detecting element 210SB. The average position of the geometric centre of the first opening of the first light-shielding layer 310a and the geometric centre of the second opening of the second light-shielding layer 310b is eccentric with respect to the geometric centre of the light-receiving surface of the photo-electric conversion portion in the −x direction. The complex microlenses of the first focus detecting element 210SA and second focus detecting element 210SB are eccentric with respect to the geometric centre of the photo-electric conversion portion in the +x direction.

In contrast to this, a first focus detecting element 250SA and second focus detecting element 250SB of a focus detecting element group 250 shown in FIG. 2 are configured such that the average position of the geometric centre of the first opening of the first light-shielding layer and the geometric centre of the second opening of the second light-shielding layer is eccentric with respect to the geometric centre of the light-receiving surface of the photo-electric conversion portion in the +x direction. The complex microlenses of the first focus detecting element 250SA and second focus detecting element 250SB are eccentric with respect to the geometric centre of the light-receiving surface of the photo-electric conversion portion in the −x direction.

In this embodiment, the respective complex microlenses of the first focus detecting pixel and second focus detecting pixel are eccentric in a direction opposite to the direction in which the average position of the geometric centre of the first opening and the geometric centre of the second opening is eccentric. Each of the complex microlenses of the first focus detecting pixel and second focus detecting pixel is constituted by a plurality of microlenses.

Other components are the same as those in the first embodiment. With the above arrangement, it is possible to enlarge the image height range in which focus detection can be performed by the pupil division phase-difference method in accordance with a pupil shift at the peripheral height of the image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-232334, filed Oct. 19, 2012, which is hereby incorporated by reference herein in its entirety.

What is claimed is:

1. An image sensor comprising:
an image forming pixel which receives a light beam passing through an imaging pupil area of an imaging optical system;
a focus detecting pixel which receives a light beam passing through a pupil area smaller than the imaging pupil area,
wherein the focus detecting pixel comprises a light-blocking layer having an opening, which limits the light beam passing through the imaging pupil area, between a lens of the focus detecting pixel and a photo-electric conversion portion of the focus detecting pixel,
the light-blocking layer overlaps with a portion of the photo-electric conversion portion of the focus detecting pixel to block light from reaching that portion of the photo-electric conversion portion, and a direction of eccentricity of the lens of the focus detecting pixel relative to a center of said pixel is opposite to a direction of eccentricity of a geometric center of the opening relative to a center of said pixel.

2. The image sensor according to claim 1, wherein the direction of eccentricity of the lens of the focus detecting pixel relative to the center of said pixel is a direction to be closer to an optical axis of the imaging optical system and the direction of eccentricity of geometric center of the opening relative to the center of said pixel is a direction to be farther from the optical axis of the imaging optical system.

3. The image sensor according to claim 1, wherein the light-blocking layer comprises a wiring layer for transferring electrical signals.

4. The image sensor according to claim 1, wherein the focus detecting pixel comprises a light-blocking layer having an opening through which a part of the light beam passes.

5. The image sensor according to claim 1, wherein the image forming pixel has one of red, green or blue spectral sensitivity and the focus detecting pixel has a white spectral sensitivity.

6. The image sensor according to claim 1, wherein the image forming pixels and the focus detecting pixels are arranged in a matrix in the row direction and column direction, and the direction of eccentricity of the lens of the focus detecting pixel is opposite to the direction of eccentricity of a geometric center of the opening at least in row direction.

7. The image sensor according to claim 1, wherein the light-blocking layer is formed by a wiring layer.

8. The image sensor according to claim 1, wherein the direction of eccentricity of a lens of the focus detecting pixel is a direction for increasing the eccentricity amount from the opening of the light-blocking layer.

9. The image sensor according to claim 1, wherein the eccentricity of the lens of the focus detecting pixel differs from the eccentricity of the lens of the adjacent image forming pixel.

10. The image sensor according to claim 1, wherein the lens of the focus detecting pixel includes an intralayer lens.

11. The image sensor according to claim 1, wherein the focus detecting pixel, in which the direction of eccentricity of the lens relative to the center of said pixel is opposite to a direction of eccentricity of a geometric center of the opening relative to a center of said pixel is arranged at least at peripheral portion in an imaging area of the image sensor.

12. The image sensor according to claim 1, wherein the eccentricity amount which is sum of an eccentricity amount of the lens and an eccentricity amount of the geometric center of the opening increases according to image height of the image sensor.

13. The image sensor according to claim 1, wherein the center of said pixel is a center of the photo-electric conversion portion.

14. The image sensor according to claim 1, wherein the image forming pixels and the focus detecting pixels are arranged in periodic pattern at a predetermined pitch, and the center of said pixel is a position of the predetermined pitch in the periodic pattern.

15. The image sensor according to claim 1, wherein the focus detecting pixel comprises a first focus detecting pixel which receives a light beam passing through a first pupil area smaller than the imaging pupil area and a second focus detecting pixel which receives a light beam passing through a second pupil area smaller than the imaging pupil area, a position of a geometric center of the first pupil area differs from a position of a geometric center of the second pupil area, a defocus amount is calculated using a pair of signals of a first focus detecting signal output from the first focus detecting pixel and a second focus detecting signal output from the second focus detecting pixel, the first focus detecting pixel comprises a first light-blocking layer having a first opening between a lens of the first focus detecting pixel and a photo-electric conversion portion of the first focus detecting pixel, the second focus detecting pixel comprises a second light-blocking layer having a second opening between a lens of the second focus detecting pixel and a photo-electric conversion portion of the second focus detecting pixel, and a direction of eccentricity of each of lenses of the first focus detecting pixel and the second focus detecting pixel relative to a center of each of the pixels is respectively opposite to a direction of eccentricity of a geometric center of the first opening and a direction of eccentricity of a geometric center of the second opening relative to a center of each of the pixel.

16. The image sensor according to claim 15, wherein a direction of eccentricity of each of lenses of the first focus detecting pixel and the second focus detecting pixel relative to a center of said pixel is a direction to be closer to an optical axis of the imaging optical system, and a direction of eccentricity of an average position of a geometric center of the first opening and a geometric center of the second opening relative to a center of said pixel is a direction to be farther from the optical axis of the imaging optical system.

17. An image capturing apparatus comprising an image sensor, the image sensor comprising:

an image forming pixel which receives a light beam passing through an imaging pupil area of an imaging optical system;

a focus detecting pixel which receives a light beam passing through a pupil area smaller than the imaging pupil area, wherein the focus detecting pixel comprises a light-blocking layer having an opening, which limits the light beam passing through the imaging pupil area, between a lens of the focus detecting pixel and a photo-electric conversion portion of the focus detecting pixel, the light-blocking layer overlaps with a portion of the photo-electric conversion portion of the focus detecting pixel to block light from reaching that portion of the photo-electric conversion portion, and a direction of eccentricity of the lens of the focus detecting pixel relative to a center of said pixel is opposite to a direction of eccentricity of a geometric center of the opening relative to a center of said pixel.

18. The image capturing apparatus according to claim 17, further comprising a calculator which calculates a defocus amount based on an object image acquired from the focus detecting pixel.

19. An image sensor comprising:

a plurality of focus detecting pixels each of which comprises a light-blocking layer having an opening between a lens of the focus detecting pixel and a photo-electric conversion portion of the focus detecting pixel, wherein the light-blocking layer overlaps with a portion of the photo-electric conversion portion of the focus detecting pixel to block a part of a light beam passing through an imaging pupil area of an imaging optical system, a direction of eccentricity of each lens of the plurality of focus detecting pixels relative to a center of the photo-electric conversion portion is a direction to be closer to an optical axis of the imaging optical system, a direction of eccentricity of the opening relative to the center of the photo-electric conversion portion is a direction to be farther from the optical axis of the imaging optical system, the plurality of focus detecting pixels include at least a first focus detecting pixel which comprises a light-blocking layer having a first opening and a second focus detecting pixel which comprises a light-blocking layer having a second opening, and a position of the first opening in the first focus detecting pixel is different from that of the second opening in the second focus detecting pixel.

20. An image sensor comprising:

an image forming pixel which receives a light beam passing through an imaging pupil area of an imaging optical system;

a focus detecting pixel which receives a light beam passing through a pupil area smaller than the imaging pupil area, wherein the focus detecting pixel comprises a light-blocking layer having an opening between a lens of the focus detecting pixel and a photo-electric conversion portion of the focus detecting pixel, the light-blocking layer overlaps with a portion of the photo-electric conversion portion of the focus detecting pixel to block light from reaching that portion of the photo-electric conversion portion, and a direction of eccentricity of the lens of the focus detecting pixel relative to a center of said pixel is opposite to a direction of eccentricity of a geometric center of the opening relative to a center of said pixel and is a direction for increasing the eccentricity amount from the opening of the light-blocking layer.

* * * * *